United States Patent
Organ et al.

(10) Patent No.: US 6,449,741 B1
(45) Date of Patent: *Sep. 10, 2002

(54) SINGLE PLATFORM ELECTRONIC TESTER

(75) Inventors: Donald V. Organ, Saratoga, CA (US); Kenneth J. Lanier, Medway, MA (US); Roger W. Blethen, Dover, MA (US); H. Neil Kelly, Westwood, MA (US); Michael G. Davis, San Jose, CA (US); Jeffrey H. Perkins, Cambridge, MA (US); Tommie Berry, Pleasanton, CA (US); Phillip Burlison, Morgan Hill, CA (US); Mark Deome, San Jose, CA (US); Christopher J. Hannaford, South Weymouth, MA (US); Edward J. Terrenzi, Walpole, MA (US); David Menis; David W. Curry, both of Cohasset, MA (US); Eric Rosenfeld, Ashland, MA (US)

(73) Assignee: LTX Corporation, Westwood, MA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/183,038

(22) Filed: Oct. 30, 1998

(51) Int. Cl.[7] .......................... H02H 3/05; G01R 31/28
(52) U.S. Cl. ........................................ 714/724; 714/46
(58) Field of Search ................................ 714/724, 725, 714/733, 734, 735, 736, 737, 738, 739, 25, 26, 30, 31, 32, 37, 44, 46, 47, 57; 324/763, 764, 758.1, 73.1, 537, 750

(56) References Cited

U.S. PATENT DOCUMENTS 4,354,268 A * 10/1982 Michel et al. ............... 714/724
5,101,153 A * 3/1992 Morong, III ................. 324/537
5,375,075 A * 12/1994 Ogata et al. ................. 702/119
5,673,272 A * 9/1997 Proskauer et al. .......... 714/724
5,717,704 A   2/1998 Rosenfeld
5,875,198 A * 2/1999 Satoh .......................... 714/740

OTHER PUBLICATIONS

LTX "Delta/STE Test System Product Description," No. 999–7824–00–BA, pp. 1–1 through10–30 (LTX Corporation Mar. 1998) (USA).

(List continued on next page.)

Primary Examiner—Christine T. Tu
(74) Attorney, Agent, or Firm—Blakely, Sokoloff, Taylor & Zafman LLP

(57) ABSTRACT

An electronic tester with digital, and analog, and memory test circuitry on a single platform. A test head is coupled to a device under test. The device under test can be a system-on-a-chip integrated circuit, a mixed signal integrated circuit, a digital integrated circuit, or an analog integrated circuit. Digital test circuitry applies digital test signals to the device under test coupled to the test head and receives digital outputs from the device under test in response to the digital test signals. Analog test circuitry applies analog test signals to the device under test coupled to the test head and receives analog outputs from the device under test in response to the analog test signals. Memory test circuitry applies memory test patterns to the device under test coupled to the test head and receives memory outputs from the device under test in response to the memory test patterns. A tester computer supervises the application of digital, analog, and memory test signals from the digital, analog, and memory test circuitry to the device under test such that signals applied to the device under test can be solely digital test signals, solely analog test signals, solely memory test signals, or mixed digital, analog, and memory test signals. The test head, the digital test circuitry, the analog test circuitry, the memory test circuitry, and the computer are operable as a single platform.

11 Claims, 26 Drawing Sheets

OTHER PUBLICATIONS

Don Organ, "enVision™: The Inside Story" Paper 25.3, pp. 530–536, 1990 International Test Conference, IEEE CH2910–6/0000/0530 (IEEE 1990) (USA).

The Delta Series, LTX Brochure (1993) (USA).

LTX Annual Report, pp. 1–4 (1994) (USA) "A Day in the Life".

LTX Envision Brochure (Prior to 1997) (USA) "If You Could Envision the Future of ATE".

Trillium Product Brochure (Prior to 1997) (USA).

LTX Delta Master Brochure (U.S.A). No Date.

The Synchro™ Test System, "Synchro Technical Manual: LInear Subsystem Programming," Chapters 1–2 and 4–6, Operating System SR5.5.0 (1997).

The Synchro™ Test System, "LTX Synchro Techniical Manual: Digital Subsystem Programming," Chapters 1–5, 14, 22, and 24, Operating System SR5.5.0 (1997).

The Synchro™ Test System, "LTX Synchro Technical Manual: VMS08," Chapters 2–4, Operating System SR5.5.0 (1997).

The Synchro™ Test System, "LTX Synchro Technical Manual: VMS20," Chapters 2–4, Operating System SR5.5.0 (1997).

The Synchro™ Test System, "LTX Synchro Technical Manual: Tester Control," Chapter 1, Operating System SR5.5.1 (1997).

The Synchro™ Test System, "LTX Synchro Technical Manual: PVI," Chapter 2, Operating System SR5.5.0 (1997).

The Synchro™ Test System, "LTX Synchro Technical Manual: RF01," Chapter 3, Operating System SR5.5.0 (1997).

The Synchro™ Test System, "LTX Synchro Technical Manual: WBS," Chapter 2, Operating System SR5.5.0 (1997).

Synchro Series: High Performance Mixed Signal ATE, LTX Corporation (1996).

* cited by examiner

SINGLE PLATFORM ELECTRONIC TESTER

A portion of the disclosure of this patent document contains material that is subject to copyright protection. The copyright owner has no objection to the facsimile reproduction by anyone of the patent disclosure as it appears in the U.S. Patent and Trademark Office patent files or records, but otherwise reserves all copyright rights whatsoever.

FIELD OF THE INVENTION

The present invention pertains to the field of electronic test equipment for testing integrated circuits. More particularly, the present invention relates to a single platform electronic tester that includes both digital, analog, and memory test circuitry for testing integrated circuits having digital circuitry, memory circuitry, and analog circuitry.

BACKGROUND OF THE INVENTION

Automatic electronic test equipment has been used to test various types of integrated circuits ("ICs") and discrete semiconductor components.

The different types of integrated circuits have included digital ICs, linear ICs, and mixed signal ICs. Examples of digital ICs include high-speed very large scale integrated ("VLSI") digital ICs, including microprocessors and microcontrollers. Linear ICs are also called analog ICs. Linear ICs are used, for example, to amplify, filter, or shape information such as sound, images, temperature, pressure, speed, acceleration, position, or rotation. Examples of linear ICs include amplifiers, voltage regulators, voltage detectors, operational amplifiers, clock circuits, and phase locked loops. Mixed signal ICs handle both digital and analog signals. One example of a mixed signal IC is a D to A converter that converts digital signals to analog signals. Another type of mixed signal IC is an A to D converter that converts analog signals to digital signals.

Different prior art automatic test equipment has been used to test different categories of ICs. Digital automatic test systems have been used to test digital ICs. Linear/mixed signal automatic test systems have been used to test linear and mixed signal ICs.

One example of a prior art digital test system is the Micromaster™ sold by LTX Corporation of Westwood, Mass. The Micromaster is designed for testing high performance CISC (complex instruction set computing) and RISC (reduced instruction set computing) microprocessors and the digital ICs that make up the chip sets that are used with the microprocessors.

One example of a prior art linear/mixed signal test system is the Synchro™ test system sold by LTX Corporation of Westwood, Mass. The Synchro automatic test system is designed for high throughput testing of linear ICs and for testing of mixed signal ICs that require lower digital pattern rates and moderate digital pin counts. The Synchro tester includes independent microprocessors that concurrently control each test instrument applied to the device under test (i.e., the IC under test). This design permits the generation of test signals and measurements on many device pins at the same time in order to speed up test times on high complexity ICs.

Trends in technology have resulted in more circuits, transistors, and other devices being placed on integrated circuits. In other words, the level of chip integration has risen. Because of this, a new category of integrated circuit has arisen, called the system-on-a-chip ICs. System-on-a-chip ICs are also referred to as multifunction ICs or multifunction devices. The system-on-a-chip ICs integrate fundamentally different IC subsystems on the same piece of silicon. These IC subsystems include VLSI logic cores, embedded memory, and mixed signal interfaces. Thus, system-on-chip ICs can incorporate digital circuitry, analog circuitry, and memory circuitry on a single chip. These subsystems were once available only on a circuit board populated with discrete devices, but now are placed on a single IC. One example of a system-on-a-chip is the Riva™ 128 graphics controller sold by nVidia, Inc., Inc. of Santa Clara, Calif. The Riva 128 is a single chip implementation of a graphics accelerator that digitally manipulates video images and then transmits them in analog form to either a computer or a television monitor.

One disadvantage of the prior art automatic electronic testers is that no single tester has the performance required to test a broad range of digital ICs, analog/mixed signal ICs, and memory ICs. To test a broad range of such types of ICs, a company would have to purchase at least two types of testers and train personnel to use at least two types of testers.

Prior art digital testers and prior art linear/mixed signal testers typically have some complementary technology, however. The prior art linear/mixed signal testers typically have some limited digital testing capability. The prior art digital testers typically have some limited analog capability. Nevertheless, complementary capabilities of both types of testers is extremely limited. Furthermore, the two types of testers are typically incompatible. This can result in higher cost of operation because test equipment is underutilized when the device that the tester can exclusively test is not being produced.

As a result, the primary disadvantage of prior art electronic test equipment is that a single platform tester cannot fully test the full spectrum of ICs, including some of the more complex ICs that have a high level of integration, such as some newer system-on-a-chip ICs. In other words, one would have to use both a digital automatic electronic tester and a linear/mixed signal automatic electronic tester to fully test certain complex multifunction ICs. Using two testers is typically relatively expensive, cumbersome, and time consuming as opposed to using a single tester. Not only is there the added expense of two machines rather than one, but typically corporations have employees who are trained on one type of tester (digital or linear/mixed signal) but not the other, and vice versa. Furthermore, some tests might be extremely difficult, if not impossible, to perform on two separate testers sequentially if there is high level of integration between analog circuitry and high speed digital circuitry on a single chip. Moreover, in certain instances, prior art testers are not capable of testing the new types of functions performed by single multifunction ICs, especially those functions that occur at increasingly high speeds.

SUMMARY AND OBJECT OF THE INVENTION

An object of the present invention is to provide a single electronic tester for testing digital integrated circuits, analog integrated circuits, mixed signal integrated circuits, and system-on-a-chip integrated circuits.

Another object of the invention is to provide an electronic tester that has a modular implementation of hardware and software of the tester.

An electronic tester is described that has digital, analog, and memory test circuitry on a single platform. A test head is coupled to a device under test. The device under test can be a system-on-a-chip integrated circuit, a mixed signal integrated circuit, a digital integrated circuit, or an analog integrated circuit. Digital test circuitry applies digital test signals to the device under test coupled to the test head and receives digital outputs from the device under test in response to the digital test signals. Analog test circuitry applies analog test signals to the device under test coupled to the test head and receives analog outputs from the device under test in response to the analog test signals. Memory test circuitry applies memory test patterns to the device under test coupled to the test head and receives outputs from the device under test in response to the memory test patterns. A tester computer supervises the application of digital, analog, and memory test signals from the digital, analog, and memory test circuitry to the device under test such that signals applied to the device under test can be solely digital test signals, solely analog test signals, solely memory test patterns, or mixed digital test signals, analog test signals, and memory test patterns. The test head, the digital circuitry, the analog circuitry, the memory test circuitry, and the computer are operable as a single platform.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

Figure 1:
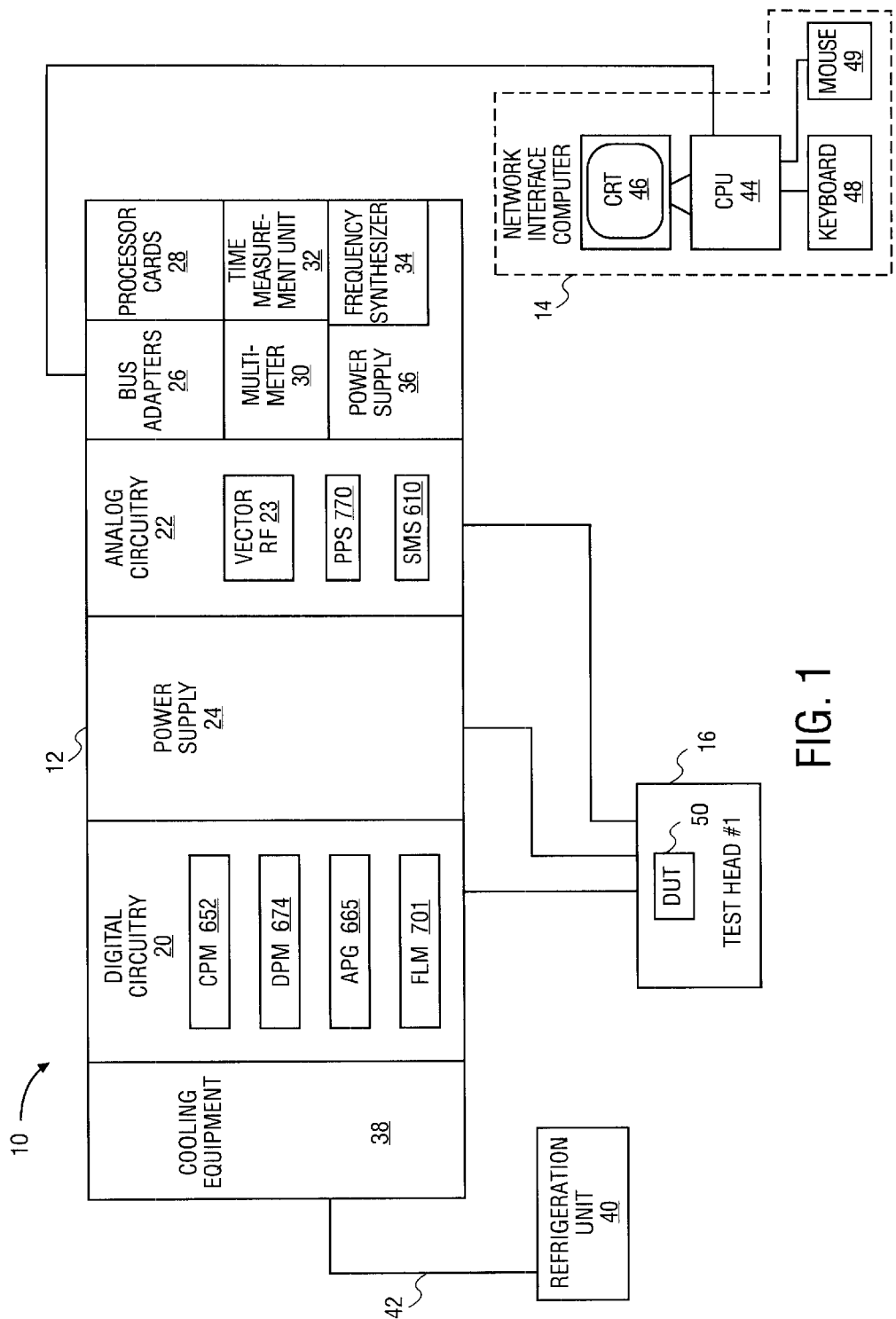
FIG. 1 is block diagram of a single platform electronic tester for testing digital ICs, analog ICs, mixed signal ICs, and system-on-a-chip ICs.

A single platform electronic tester is described that can test digital integrated circuits, analog integrated circuits, mixed signal integrated circuits, and system-on-a-chip integrated circuits. Various aspects of the single platform electronic tester are described in more detail below. A computer of the tester causes a tester controller to send action packets to analog test circuitry to execute analog tests of a device under test ("DUT"). The computer also causes the digital test circuitry to execute digital tests of the DUT.

The electronic tester of one embodiment includes a system of distributed processing, synchronization, and highly interchangeable components. An intended advantage is to provide a highly flexible tester that can be relatively quickly and easily reconfigured to test digital ICs, analog ICs, mixed signal ICs, or system-on-a-chip ICs. An intended advantage of this approach is to scale tester cost and size more exactly to the requirements of the particular integrated circuits being tested.

A computer-generated graphical user interface of the electronic tester allows a user to launch an operating system of the electronic tester that can execute digital and analog test programs. As described in more detail below, a graphical user interface of the electronic tester allows the memory components, digital components, and analog components of a test program to automatically execute one followed by the other. Any number of memory components, digital components, and analog components can follow each other. Furthermore, the digital, analog, and memory components of a test program can execute concurrently.

The electronic tester also includes a computer that can display a graphical user interface that allows a user to see and arrange the flow of test program execution that contains digital, analog, and memory test components. The electronic tester also includes a graphical user interface that allows the user to display source code of the analog, memory, and digital test program components and a graphical user interface that allows debugging of the memory, digital and analog test program components.

In the electronic tester, digital test procedures can be called from an analog test program and analog test procedures can be called from a digital test program.

The electronic tester also includes special timing circuitry to help to ensure proper synchronization. A component of the electronic tester, acting as a master, sends a timing marker over a marker bus. A modular test circuit retrieves the timing marker from the marker bus. The modular test circuit starts a test on a DUT upon receipt of the timing marker. The test is controlled by a test sequence predefined for the modular test circuit prior to retrieval of the timing marker by the modular test circuit.

Clocking circuitry of the electronic tester is also described in more detail below. Each digital test circuit has a high speed clock generator. That high speed clock generator generates a clock having a frequency that is adjustable in multiples of an input frequency. A variable frequency clock provides an input frequency for the clocks of the digital test circuitry. The variable clock generator has a continuously adjustable clock frequency that determines the input or reference frequency for each of high speed clock generators coupled to the digital test circuits. Analog circuits are coupled to high speed analog clocks. Both the digital variable reference clock and the analog high speed clocks are referenced to a single, fixed frequency reference in order to provide frequency coherence among the various elements of the test system. The fixed frequency reference is a low speed clock.

A discussion of the hardware and software of the electronic tester is set forth below in connection with FIGS. 1–6. A discussion of the graphical user interfaces of the electronic tester is set forth in connection with FIGS. 7–15. The action bus of the electronic tester is described in connection with FIG. 16. Digital and memory test circuitry is described in connection with FIGS. 17–21. Analog test circuitry of the electronic tester is described in connection with FIGS. 22–23. Clocking circuitry and associated circuitry of the electronic tester is discussed in connection with FIGS. 24–26.

FIG. 1 is a block diagram of electronic tester 10 with digital and analog test circuitry for testing device under test 50. Electronic tester 10 is a single platform tester. Electronic tester 10 includes test head 16 that includes connector pins for receiving device under test 50. Device under test 50 can be a system-on-a-chip integrated circuit, a mixed signal integrated circuit, a digital integrated circuit, and IC memory, or an analog integrated circuit. For an alternative embodiment of the invention, electronic tester 10 includes a second test head.

The main body 12 of electronic tester 10 includes cooling equipment 38, digital test circuitry 20, power supply 24, analog test circuitry 22, bus adapters 26, processor cards 28, multimeter 30, time measurement unit 32, frequency synthesizer 34, and power supply 36. Refrigeration unit 40 is coupled to cooling equipment 38 via refrigeration line 42.

Network interface computer 14 controls the overall operation of electronic tester 10 and is coupled to main body 12. Network interface computer 14 includes a central processing unit ("CPU") 44, cathode ray tube ("CRT") 46, keyboard 48, and mouse 49. For one embodiment of the present invention, network interface computer 14 is a SPARC™ workstation sold by Sun Microsystems of Mountain View, Calif.

Digital test circuitry 20 is the test circuitry used to generate test vectors sent to device under test 50. Digital test circuitry 20 includes a card cage that for one embodiment holds 16 printed circuit boards. Each printed circuit board has 16 digital pattern generators. Digital circuitry 20 has four racks of card cages, for a total of 64 printed circuit boards, wherein each printed circuit board has 16 digital pattern generators. The control pattern memory processing unit 652 uses a flexible set of microinstructions to generate complex pattern sequences that require looping, conditional branching, and nested subroutines. The control pattern memory processing unit 652 also provides microinstruction control over per pin pattern source selection, data pattern memory sequencing, and algorithmic pattern generator algorithms. The digital pattern memory processing unit 674 provides long sequential vector patterns with vector repeat capabilities, which allows engineers to simulate digitally intensive devices. Each digital pattern generator is a customized integrated processor that executes assembly codes step by step upon receipt of clock input. The digital pattern generators are microcoded. Thus, each digital pattern generator operates as a sequencer.

Each digital pattern generator of digital test circuitry 20 includes a control pattern memory processing unit 652 and a data pattern memory processing unit 674.

The digital pattern generators of digital circuitry 20 can drive 1,024 pins of DUT 50 in parallel. For one embodiment, the digital pattern generators of digital circuitry 20 operate at speeds up to 500 megahertz.

For one embodiment, digital test circuitry 20 also includes algorithmic pattern generator ("APG") 665 for producing patterns for testing embedded memory arrays of DUT 50. Digital test circuitry 20 further includes fail log memory 710 for capturing accumulated failures, which is used for testing memories.

Analog test circuitry 22 includes circuitry for sending and receiving analog signals with respect to DUT 50. Analog test circuitry 22 includes sequenced measure system™ ("SMS") 610. Sequenced measure system 610 features analog performance from direct current ("DC") to 100 megahertz and local digital signal processing ("DSP") that eliminates data transfers through electronic testor 10. For one embodiment, the sequenced measure system 610 contains analog circuitry optimized for analog waveform operations up to 100 megahertz. For an alternative embodiment, sequenced measure system 610 is optimized for lower frequency higher precision operations. For one embodiment, a portion of SMS circuitry 610 also resides within test head 16.

For one embodiment, analog test circuitry 22 also includes pulsed power source ("PPS") 770. PPS 770 is a multi-channel high power voltage/current source designed to test smart power blocks on system-on-a-chip ICs. For one embodiment, a portion of PPS circuitry 770 also resides within test head 16.

For one embodiment, analog test circuitry 22 also includes vector RF (radio frequency) source and measure unit 23. The vector RF unit 23 provides basic scalar source and measure, modulation, and vector network measurements such as S parameters with respect to DUT 50. For one embodiment, a portion of vector RF unit circuitry 23 resides within test head 16. Vector RF unit 23 is used for testing single-chip transceivers, IQ modulators and demodulators, power amplifiers, VCOs, mixers, LNAs, synthesizers, and phase-lock loops ("PLLs"), for example.

Bus adapters 26 of electronic tester 10 are interfaces between various types of buses used within electronic tester 10. Processor cards 28 include the microprocessors used within electronic tester 10 to perform various functions.

Multimeter 30 is used as a voltage tester to measure various signals, including signals coming to and from DUT 50. For one embodiment of the invention, multimeter 30 is an HP multimeter sold by Hewlett Packard, Inc. of Palo Alto, Calif.

Time measurement unit 32 is a four channel precision time measurement system with a local processor. This system contains two special gate channel inputs in addition to the start and stop channels through which it can accept gating signals, timing strobes, and timing patterns from external sources. Start and stop events from DUT 50 can be synchronized with the third DUT output or with another timing source such as a digital pin. For one embodiment, the time measurement unit 32 is sold by Wavecrest Inc. of Edina, Minn.

Time measurement unit 32 also contains a programmable hold off counter (not shown) that allows time measurement unit 32 to measure time intervals within a sequence of events specified for the test engineer, including near simultaneous start/stop events. Testing can start and stop anywhere on a leading edge, a trailing edge, after a timing event, or after a series of events.

Frequency synthesizer 34 generates a variable speed clock for the digital test circuitry 20 of electronic tester 10. For one embodiment of the present invention, frequency synthesizer 34 is a PTS 310D synthesizer sold by Programmed Test Sources of Littleton, Mass. The frequency of the frequency synthesizer 34 can be adjusted.

Power supplies 24 and 36 of electronic tester 10 supply power to various circuitry of electronic tester 10.

Refrigeration unit 40 and cooling equipment 38 is used to circulate liquid to cool electronic circuitry of electronic tester 10.

Figure 2:
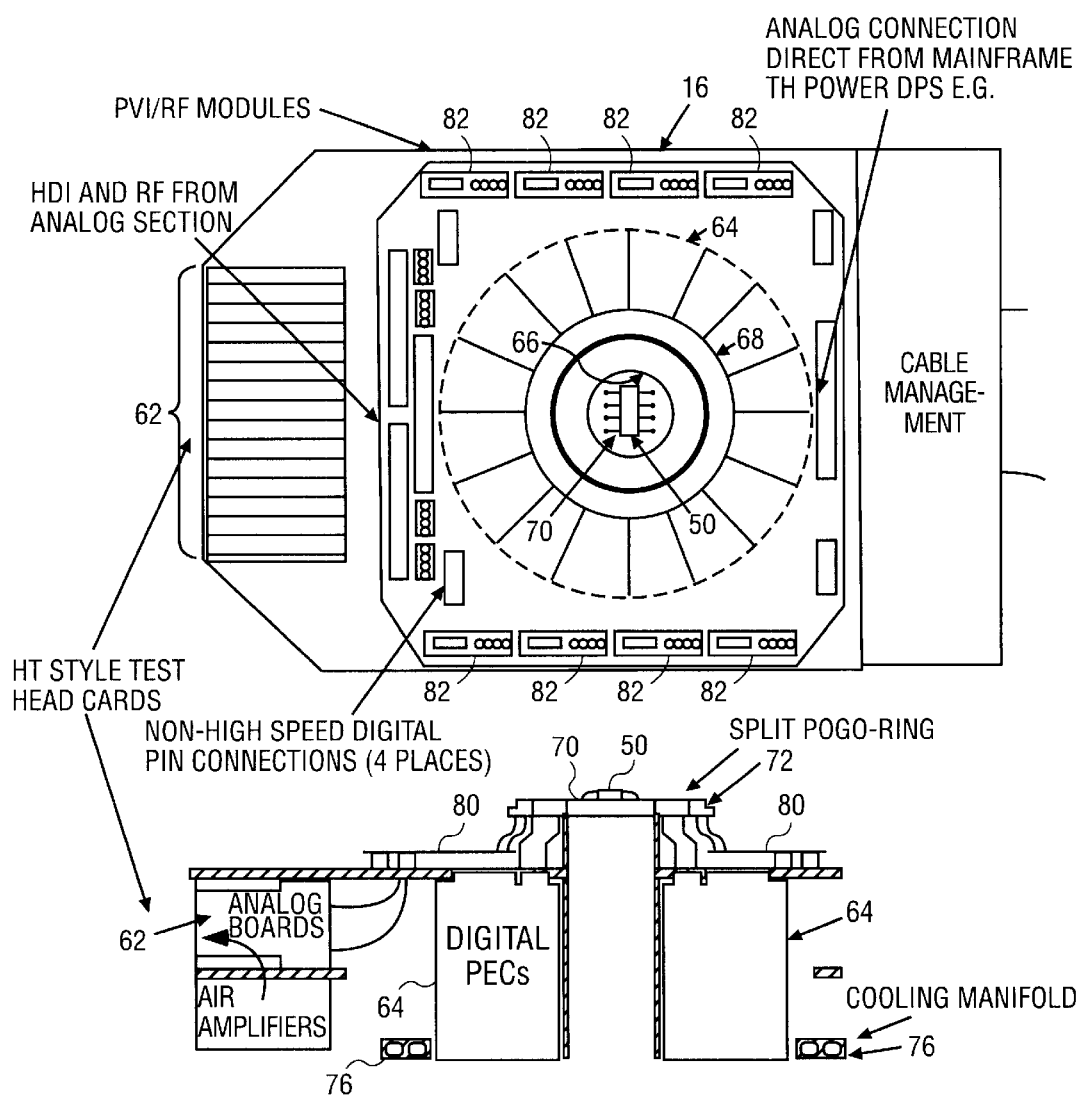
FIG. 2 illustrates an electronic tester test head that holds both digital test boards and analog test boards.

FIG. 2 illustrates test head 16 of electric tester 10. Device under test 50 resides on a custom DUT board 70 that is installed on test head 16. DUT card 70 is a custom designed printed circuit card that has circuit traces that electrically connect to metallic pogo pin contacts found in connector fields 66 and 68.

Connector field 66 is made up of digital metallic connector pins that are coupled to respective digital pin electronic cards 64 that reside on the bottom of test head 16. Connector field 68 is made up of metallic connector pins that are coupled to respective analog test boards 62 that reside in the front of test head 16. Each of the pins in the analog connector field 68 is optimized for the type of analog signal being transmitted. For example, coaxial connectors are used for RF signals to facilitate high bandwidth, low loss, blind-mate connections.

For one embodiment of the invention, test head 16 includes 1,024 digital pogo pins within digital connector pin ring 66. For one embodiment, 500 analog connections reside within analog connector field 68.

System configuration module™ ("SCM") board 80 maps tester resources to DUT board 70 and allows for market specific customization of signal circuitry for testing families of devices. For one embodiment, test head 16 can hold 32 analog or mixed signal boards 62. Analog boards 62 are also called mixed signal boards 62. For one embodiment of the present invention, analog boards 62 are custom designed for the user to perform the desired analog or mixed signal test with respect to DUT 50. SCM board 80 includes relays and capacitors for switching analog signals between analog board 62 and DUT 50. For one embodiment of the present invention, SCM board 80 is custom designed by the user to achieve the desired analog or mixed signal test with respect to the DUT 50. Outer analog connector field contains 500 analog connections and is coupled to SCM board 80.

Test head 16 can hold 64 pin electronics cards 64. Digital pin electronics cards 64 are configured in a circular pattern underneath DUT board 70. Digital pin electronic cards 64 provide relatively high bandwidth source and measure. Digital pin electronic cards 64 have relatively fast and programmable rise and fall times. Clock pulse widths go down to 600 picoseconds for one embodiment. The pin electronics cards 64 include an interface that provides a two-nanosecond electrical distance between any one of the 1,024 digital channels and the DUT 50 socket. Pin electronics cards 64 have the ability to generate low voltage driver voltage swings of as little as 50 millivolts for one embodiment. Pin electronics cards 64 include high bandwidth comparators, with 1.0 gigahertz a typical terminated bandwidth for one embodiment. Pin electronics cards 64 include circuitry to limit overshoot caused by impedance mismatches.

For one embodiment, pin electronics cards 64 include a differential drive and compare circuitry. In the differential drive mode, one set of data is fed into two drivers. One of the drivers inverts the data resulting in an accurate differential signal. Because the drivers are on the same piece of silicon, the signals are affected equally by drift and interference so they stay matched. A differential comparator determines the difference between the inputs so it is able to ignore common mode signals. Circuitry subtracts the voltages without assigning a binary state and a dual threshold comparator can determine whether the signal passes the voltage thresholds.

For one embodiment of the invention, test head 16 also includes 8 slots for accommodating radio frequency ("RF") and power modules. Each of the eight module slots 82 on test head 16 contains shielded, high bandwidth connectors for RF, and high current connectors for power.

Test head 16 also includes liquid cooling manifolds 76.

Figure 3:
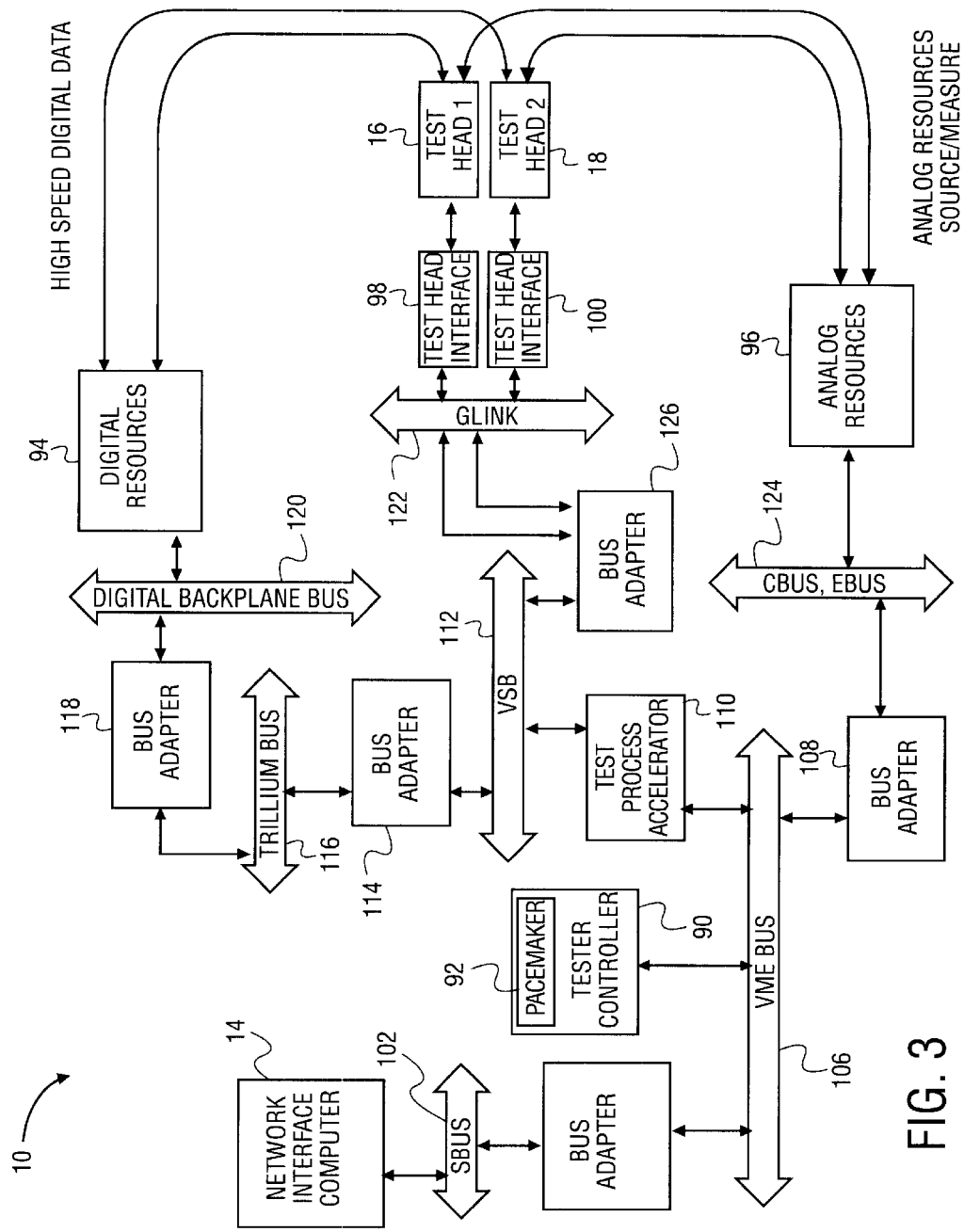
FIG. 3 is a block diagram of the electronic tester that shows various data and control buses.

FIG. 3 shows the bus structure and overall architecture of electronic tester 10. The embodiment shown in FIG. 3 includes a second optional test head 18 for testing a second DUT.

Network interface computer 14 is coupled to Sbus 102. Bus adapter 104 couples Sbus 102 to VME bus 106. Tester controller 90 is coupled to VME bus 106.

Tester controller 90 includes pacemaker circuitry 92 for establishing timing and providing an independent clock reference.

Bus adapter 108 couples VME bus 106 to Cbus/Ebus 124. Analog resources 96 are coupled to Cbus/Ebus 124. Analog resources 96 are also coupled to test heads 16 and 18. Analog resources 96 include circuitry for doing analog source and measure tests with respect to test heads 16 and 18.

Test process accelerator 110 is coupled to both VME bus 106 and VSB bus 112. Bus adapter 126 is coupled to VSB bus 112 and GLINK bus 122. GLINK bus 122 is in turn coupled to test head interfaces 98 and 100. Test head interface 98 is coupled to test head 16 and test head interface 100 is coupled test head 18.

Bus adapter 114 is coupled to both VSB bus 112 and Trillium bus 116. Bus adapter 118 is coupled to Trillium bus 116 and digital backplane bus 120.

Digital backplane bus 120 is coupled to digital resources 94. Digital resources 94 are coupled to test heads 16 and 18. Digital resources 94 are used for high speed testing with respect to digital data.

Figure 4:
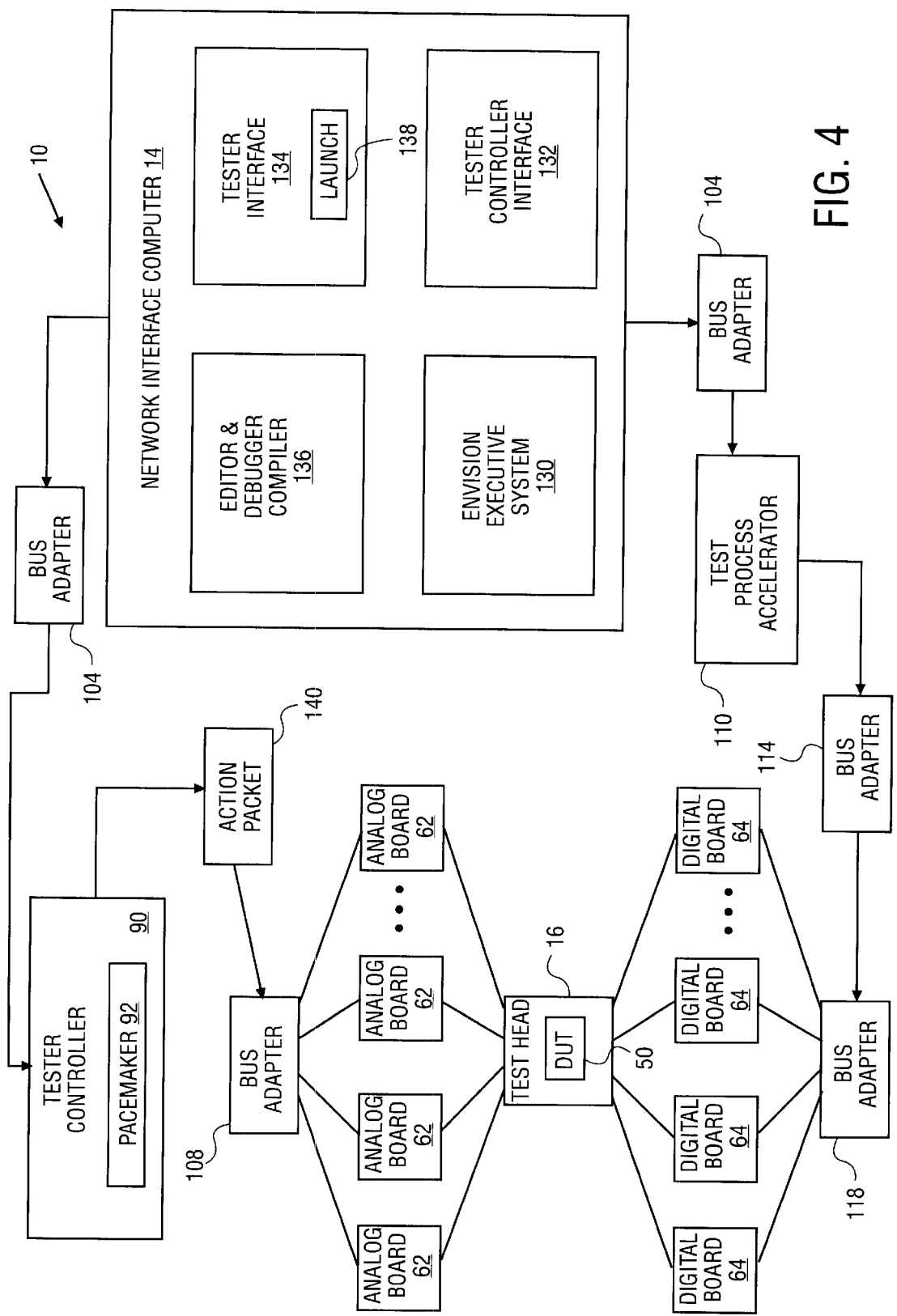
FIG. 4 is a block diagram of the electronic tester that shows the configuration of the network interface computer with respect to the tester controller, the test process accelerator, and the digital and analog boards of the test head.

FIG. 4 is a view of the architecture of electronic tester 10 with respect to network interface computer 14, tester controller 90, test process accelerator 110, analog boards 62, and digital boards 64.

Network interface computer 14 oversees digital tests, and analog tests, and memory tests with respect to device under test 50 located in test head 16. For analog tests, network interface computer 14 sends a signal to tester controller 90 via bus adapter 104 requesting that tester controller 90 initiate an analog test with respect to DUT 50. Pacemaker 92 is part of tester controller 90. Pacemaker 92 establishes timing for the analog test. Pacemaker 92 provides an independent clock reference that analog boards 62 can obtain synchronization with respect to.

Cadence™ is the operating system for tester controller 90 for controlling analog tests with respect to DUT 50. Cadence is also the name for the computer language for writing test programs for analog tests of DUT 50.

To perform an analog test, tester controller sends an action packet 140 to bus adapter 108, which in turn sends the action packet 140 to analog boards 62. Analog boards 62 are coupled to test head 16 and in turn coupled to device under test 50. Analog boards 62 contain circuitry for performing analog source and measure tests with respect to device under test 50.

Figure 5:
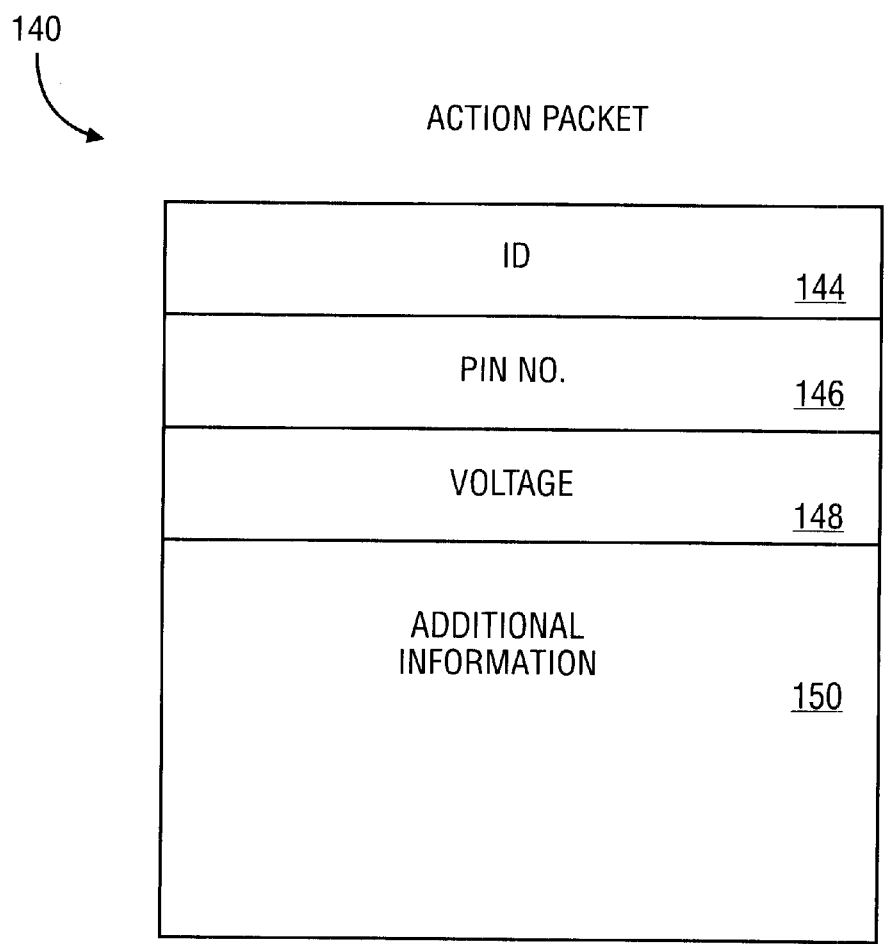
FIG. 5 illustrates an action packet of the electronic tester.

Action packet 140 is shown in more detail in FIG. 5. Action packet 140 includes an identification number area 144 that identifies the test circuitry that is to perform a test and what function or action is to be taken by that test circuitry with respect to DUT 50. For example, the sequenced measure system 610 would look at the identification number area 144 of action packet 140 to see if SMS 610 is to perform a test and to see what action is to be taken. Action packet 140 also includes a pin number area 146 for identifying the pin of DUT 50 that is to be tested. Action packet 140 includes an area 148 for the identification of the voltage that is to be applied to a pin (identified in area 146 of the action packet) of device under test 50.

For an embodiment of the invention, action packet 150 also includes area 150 for providing additional information with respect to the analog test with respect to device under test 50. For example, for a forcing voltage test, the additional information 150 would include the current range and the current clamp value.

Tester controller 90 of FIG. 4 is microprocessor controlled. For one embodiment, tester controller 90 includes a 68030 microprocessor sold by Motorola Corporation of Schaumburg, Ill. For one embodiment, the microprocessor of tester controller 90 executes the Cadence programming language. The Cadence programming language is available from LTX Corporation of Westwood, Mass. Cadence is a programming language that is similar to Pascal, but that is tailored for electronic test applications.

The action packets 140 sent by test controller 90 are destined for analog boards 62 shown in FIG. 4. Analog boards 62 are also called test modules 62. For one embodiment, at least one of the analog boards 62 contains either a 68000 series microprocessor sold by Motorola Corporation of Schaumburg, Ill. or a Power PC™ microprocessor sold by Motorola Corporation of Schaumburg, Ill.

Digital testing and memory testing of DUT 50 can occur concurrently with respect to analog testing of DUT 50. Digital testing, analog testing, and memory testing of DUT 50 can also occur in a serial manner.

Network interface computer 14 also oversees digital testing and memory testing with respect to device under test 50 located in test head 16. Network interface computer 14 sends a signal over bus adapter 104 to test processor accelerator 110. Test process accelerator 110 in turn sends a signal over bus adapter 114 and bus adapter 118 to digital boards 64. Digital boards 64 are also called digital pin electronics cards 64. Digital boards 64 in turn apply digital test signals and memory test patterns to device under test 50 in test head 16 and monitor the response of DUT 50 to those digital test signals and memory test patterns. For one embodiment of the present invention, test processor accelerator 110 includes a 68040 microprocessor sold by Motorola Corporation of Schaumburg, Ill.

For one embodiment, network interface computer 14 is a SPARC workstation sold by Sun Microsystems of Mountain View, Calif. The operating system for network interface computer 14 is UNIX.

An enVision++ executive system 130 is the operating environment for network interface computer 14. The enVision++ executive system 130 runs on top of UNIX.

Network interface computer 14 also includes a tester controller interface 132 that runs on top of UNIX. Tester controller interface 132 is the interface to the Cadence operating system of tester controller 90.

Editor and debugger compiler 136 also runs on the UNIX operating system on network interface computer 14. Editor and debugger compiler 136 allows the user to edit, debug, and compile both Cadence analog test programs and digital and memory test programs that run in the enVision++ executive system 130. The editor portion of editor and debugger compiler 136 allows one to add and delete lines of source code. The debugger portion of editor debugger and compiler 136 allows one to debug the digital and analog test programs, for example, by allowing one to insert break points. The compiler portion of editor debugger and compiler 136 is line oriented and compiles the test programs and procedures.

Tester interface 134 also runs on UNIX on network interface computer 14.

Tester interface 134 is also called the enVision++ launcher. Tester interface 134 allows one to start or launch the test program enVision++ environment by clicking launch button 138 with a computer mouse 49. Tester interface 134 is also called the enVision++ launcher 134 or just lanucher 134.

Figure 6:
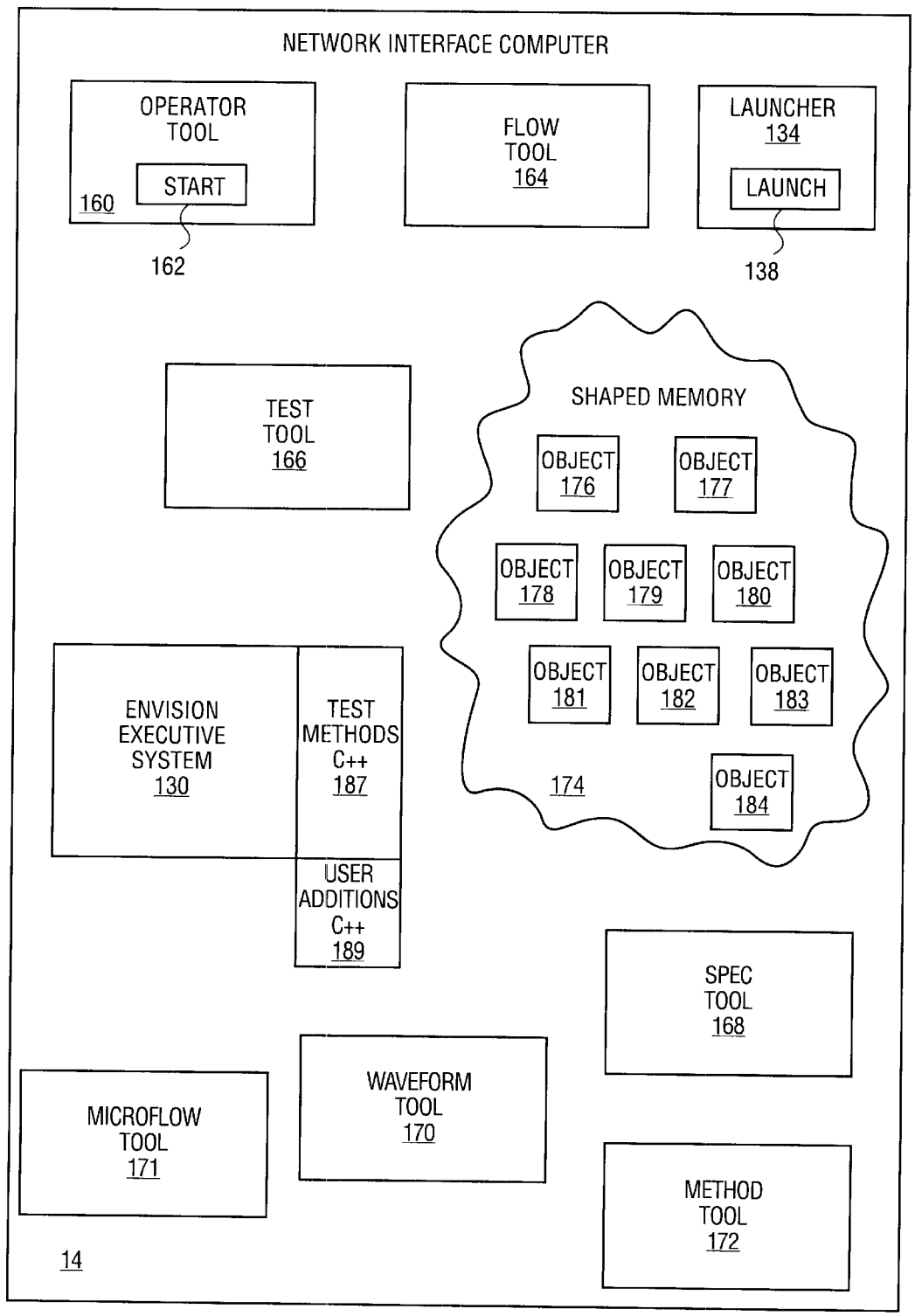
FIG. 6 shows tools and data objects of the network interface computer of the electronic tester.

FIG. 6 shows some of the software components of network interface computer 14. The enVision++™ executive system 130 is launched by the enVision++ launcher 134. The enVision++ executive system 130 is also called the enVision++ software system, the enVision++ operating environment 130, or the test program environment 130. The enVision++ executive system runs on top of UNIX and is a visual operating system using OSF/Motif. enVision ++ includes a device oriented graphical user interface ("GUI"). By using an X Windows system, the enVision++ operating system may be run from any X Windows terminal or workstation capable of running X Windows. The enVision++ executive system 130 controls the digital test circuitry, the analog test circuitry, and the memory test circuitry of electronic tester 10.

enVision++ operating system 130 is an object oriented platform. enVision++ 130 is tester architecture independent. enVision++ 130 uses an application-oriented test program information base. enVision++ 130 has a reusable, modular test program structure. enVision++ 130 uses real time interaction with no batch compilation. enVision++ 130 uses graphical user interfaces for all functions. enVision++ 130 includes off line simulation features. enVision++ 130 also includes integrated characterization tools. enVision++ 130 includes hierarchical waveform and pattern objects. enVision++ 130 uses distributed expression processor capabilities. enVision++ 130 also uses standardized methodology. enVision++ 130 relies on an application oriented structure of test information.

Operator tool 160 is used by the user to specify and load a test program. A test program is loaded by selecting start button 162 with mouse 49.

A test program developed in the enVision++ executive system 130 consists of a set of objects, such as objects 176 through 184, that are stored in shared memory 174 on the network interface computer 14. Objects 176 through 184 are interconnected at the object level. Each of objects 176 through 184 can be viewed by means of an associated tool that provides visual display and modification of the object. Objects can include, for example, test objects, flow objects, spec objects, pattern objects, and levels objects.

An enVision++ test program running within the enVision++ executive system 130 is a database of test objects, such as digital waveforms, analog waveforms, and pin maps. There are several different classes of test information objects. Each object contains information about some part of the test program. All test objects except patterns are saved on a disk of network interface computer 14 in a compact ASCII syntax.

The test engineer builds a test program as a series of test objects and procedures using a graphical user interface to navigate the library of options. The tester interface resolves the test program for the specific tester configuration. In particular, the tester interface resolves the test information contained within the test information objects and procedures into specific tester data and commands. This software architecture lets the test engineer create test programs that are tester independent, eliminating the need to port and maintain multiple versions of the same tester program for different tester types. Different test programs can use common test objects and procedures.

Test objects can be hierarchical and refer to external object files. For example, the test engineer can maintain the test specification object as a separate file so that it can be used by several programs. This allows the test engineer to partition test program information in order to support common test specifications, patterns, timing, and device packages. The data contained within an object is application specific information and would be the same for different testers.

Test objects interact with or refer to other test objects. For example, a spec sheet object can contain the test specifications used by several programs. Upgrading the object updates all test programs using that object. Each data object can be viewed by means of an associated tool that provides for visual display and modification of the object.

No matter how an object is generated, interactively or through an ASCII mechanism, once in shared memory 174 the object, such as objects 176 through 184, is viewed and manipulated with the same tools. Once loaded, the ASCII source files no longer need to be kept on line. A test program, when loaded, exists in the shared memory of network interface computer 14. When a test program is saved to disk, the test program is transferred into the ASCII syntax for the objects. A test program object contains a list of all the other objects that make up the test program. When this test program is selected for loading, all of the objects that it contains are loaded back into shared memory 174 in executable form once again. Several test program objects may be created for a given test program thereby allowing variations of the test program to be made for different applications (such as for wafer sort and final test). It is possible, once into the enVision++ shared memory 174 environment, to selectively load objects from other test programs.

Once a program is saved, the user has the option of saving only the objects that have changed and links to the test program that contain all the unchanged objects, When a program is loaded, the information is resolved into specific attributes of the selected tester. Tester resource allocation and rules checking is performed at this time. Pattern, waveform, and timing information is resolved into the specified tester implementations. Programs can also be loaded, resolved, and simulated off line.

The enVision++ executive system 130 provides a total system integration of multisite testing (parallel testing) capability for up to 32 sites for one embodiment.

STIL objects can be read into the enVision++ executive system 130 through a STIL reader and then modified and saved as enVision++ test objects.

Each test in an enVision++ program selects a test method from a library of test methods and provides the test specific parameters and conditions. The library is a collection of generic procedures that cover a spectrum of very large scale test applications. A test method provides a standardized predefined test process (e.g., a leakage test) that is intended to be common for all test programs.

Test methods 187 are procedural functions that are written in the C++ language to perform a certain test or classes of tests on the device under test 50. Test methods 187 are stored in a library located on network interface computer 14 for inclusion into a test program via the test tool 166. The test methods 187 are complete and designed with necessary debug and characterization options.

The enVision++ executive system 130 allows the test engineer to write additions 189 to test methods 187. The user additions are written in the C++ language. The test engineer is typically given the source code and can make variations to the source code. Test engineers can also write their own code and create their own objects, although for one embodiment new object types cannot be created by a test engineer. For an alternative embodiment, new object types can be created by a test engineer.

Cadence procedures (also referred to as Cadence test components) are analog test procedures with respect to DUT 50 that are written in the Cadence language and executed by tester controller 90 (shown in FIG. 4). A Cadence module contains Cadence test procedures.

The enVision++ executive system 130 shown in FIG. 6 includes an expression processor. The expression processor of the enVision++ executive system 130 is software from the software library of the enVision++ executive system 130 that executes formulas or expressions. The expression processor allows expressions or formulas to be used in any place where a constant value would normally be used. This includes, for example, usage in spec parameter cells, test parameters, port exit conditions, reference level setup, and waveform timing setup.

The tools of the enVision++ executive system 130 include the operator tool 160, the test tool 166, the flow tool 164, the waveform tool 170, the spec tool 168, the microflow tool 171, and the method tool 172. The tools include programs necessary to build a usable test program, tools a device engineer needs to tune and perfect the test program, tools that communicate results of tests to the operator, and other types of tools.

The spec tool 168 is a testing tool that allows a test engineer to tune and perfect a test program. The spec tool 168 is used to define parameters and expressions made up of parameters. The parameters are organized into categories that can be selected by a flow object. The parameters can be used in other objects and test methods. As the device is tested in different categories (i.e., speed categories), the objects and test methods are not affected.

The waveform tool 170 is another type of testing tool. The waveform tool 170 defines the waveform and timing relationships in a test pattern. These relationships resolve each of the vector cycle formats from the test patterns. This is done for all unique test vector combinations before the test pattern can be run. Cycle formats may be built on a cycle-to-cycle basis across all signals of the device under test 50, or they may be built hierarchically with groups of signals and over multiple cycles. Because multiple cycles are defined together, the error checking can test for cycle-to-cycle timing violations. The software handles mapping the on-screen drawn waveforms onto the specific tester 10 hardware. The waveform tool 170 also reads a response log memory and displays the actual waveform at as it was seen by comparators of tester 10.

Operator tool 160, flow tool 164, test tool 166, method tool 172, microflow tool 171, and launcher 134 are described in more detail below.

Figure 7:
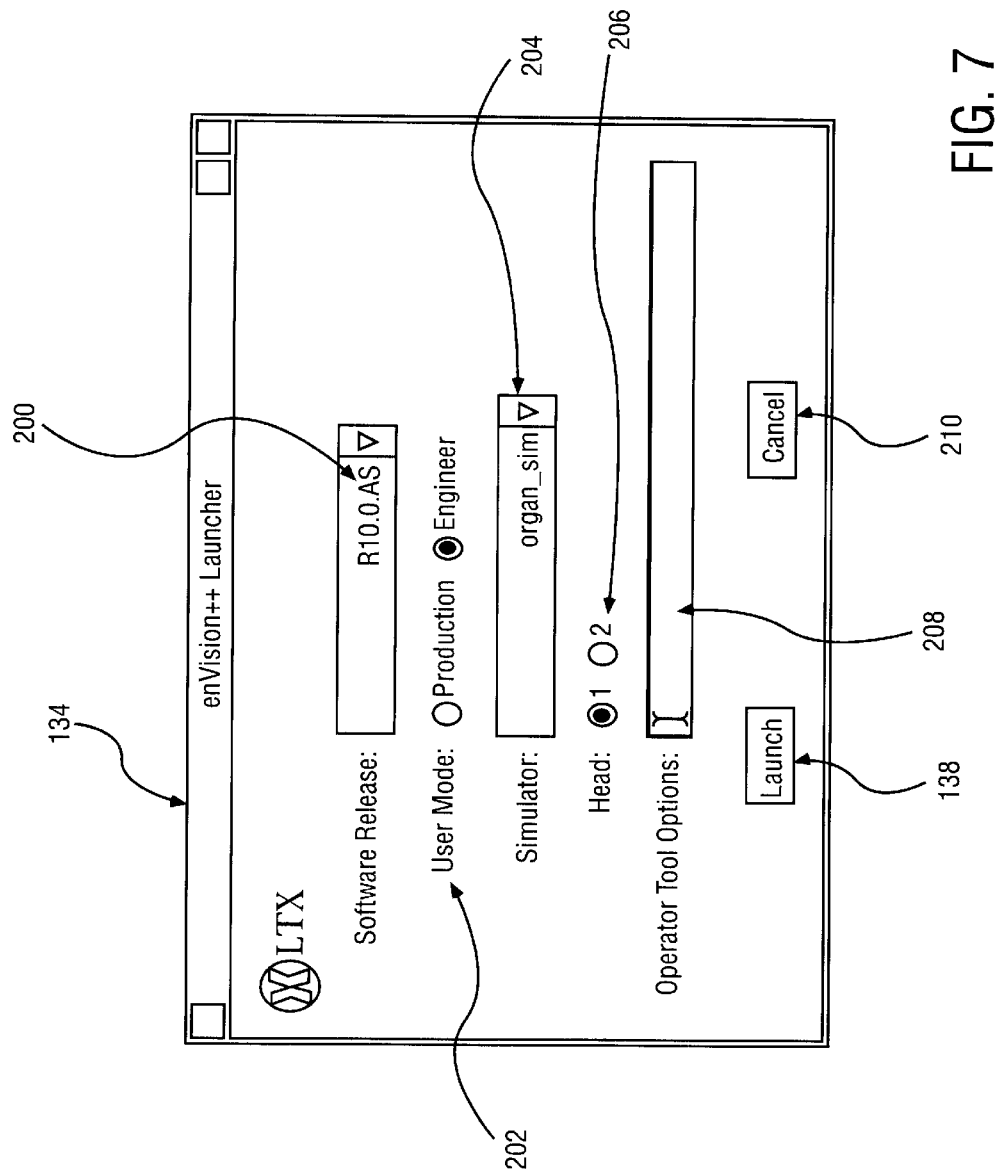
FIG. 7 shows the graphical user interface of the launcher of the electronic tester.

FIG. 7 illustrates the graphical user interface for enVision++ launcher 134. enVision++ launcher 134 allows the user of the electronic tester 10 to launch the enVision++ operating environment 130. The user uses mouse 49 to click on the launch button 138 to launch the enVision++ executive system on network interface computer 14. The graphical user interface 134 shown in FIG. 7 is the interface that appears to the user viewing the cathode ray tube 46 of network interface computer 14.

Menu box 200 shows which software release of enVision++ is being launched by network interface computer 14. The user can click with mouse 49 on user mode buttons 202 to indicate whether the enVision++ is in the production mode or the engineer mode. The user can indicate that a simulator mode is being used by using menu box 204. Buttons 206 allow the user to indicate which test head of electronic tester 10 is being used for the embodiment of tester 10 with two test heads. By typing on line 208, the user can indicate an operator tool option. The cancel button 210 allows the user to cancel the current use of launcher 134, which results in the display of graphical user interface 134 being closed.

Figure 8:
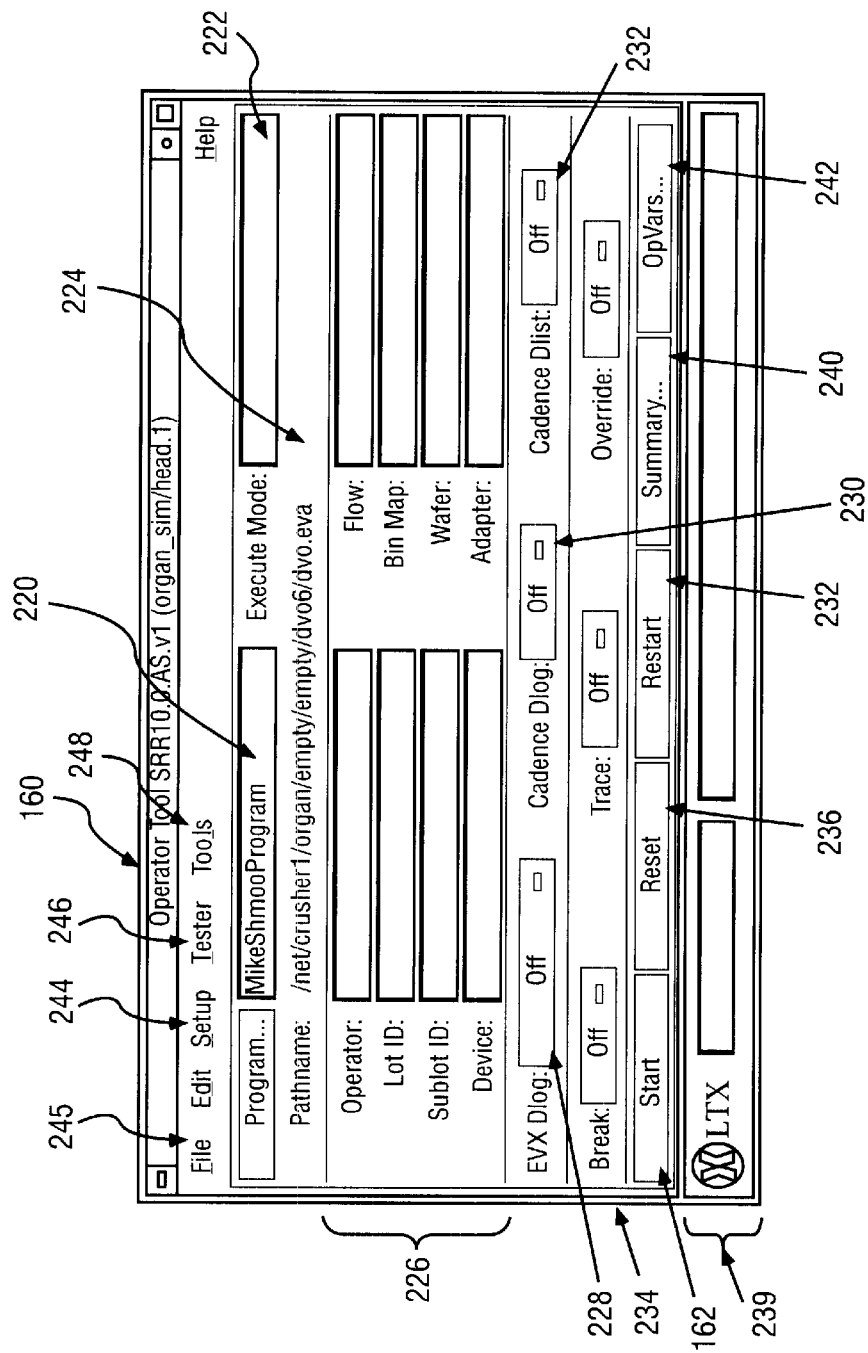
FIG. 8 shows the graphical user interface of the operator tool of the electronic tester.

FIG. 8 illustrates the graphical user interface for operator tool 160 of enVision++ executive system 130. Operator tool 160 allows the user of the electronic tester 10 to specify the test program to load. Operator tool 160 also allows the user to specify the flow and load board object to use. The test program can be executed from operator tool 160, and indicators as to program status, and loop or single execute mode are available. Bin results go to a separate tool called the bin tool (not shown) and are not shown directly on the operator tool 160. The bin tool shows which bin a DUT 50 goes into after failing a test.

The user can start a test program by clicking with mouse 49 on the start button 162. The user can reset by clicking on button 236. The user can restart a test program by clicking on button 238.

The electronic test engineer who is using electronic tester 10 can specify the program name in line 220 of operator tool 160. The path name for the program specified in line 220 is set forth in area 224.

On line 222 the user can select an execution mode to run on a single pass, loop continuously, or loop until some condition is met. Lines 226 of operator tool 160 allow test option parameters to be displayed and altered. Those test option parameters are global to the test program. Lines 226 include allow the display of lot summary information and wafer displays. When the user pulls down the File menu 245 and clicks mouse 49 on the "Load" command, the fields within area 226 are filled in by the test program. Summary button 240 can be used to display how many devices were tested, how many failed, etc.

The pull down menu 248 called "Tools" allows the start-up by the user of any other test tools of the enVision++ executive system 130.

The setup pull down menu 244 allows the user to establish the setup of function keys on the tester interface computer 14. The setup 244 pull down menu also allows the user to specify the tester hardware initialization and specify the prober/handler set up.

Operator tool 160 allows protection to prevent unauthorized access to the tools that allow modification of a test program. Controls 234 allow the turning off and on of the break, trace, and override features. When the break button is turned on, the testing stops at break points.

The user can select button 242 for specifying operator variables. The operator variables are the variables that the production operator of electronic tester 10 can control. The test temperature is an example of an operator variable.

Operator tool 160 provides a common way to start both digital test programs and analog test programs. Operator tool 160 allows the user to load enVision++ executive digital test programs for testing the device under test 50. The operator tool 160 also allows the user to load Cadence source and binary file formats for analog testing of the device under test 50. The programs that can be specified in line 220 include both digital and analog test programs. Thus, the user of electronic tester 10 sees a common graphical user interface in the form of operator tool 160 when he or she wants to start a test program by pressing the start button 162.

Button 230 of operator tool 160 allows the user to turn on or turn off the data log for the Cadence operating system for analog testing. When the datalog for the Cadence operating system is turned on, the measurements made during analog testing of DUT 50 are written to a file. Button 232 of operator tool 160 allows the user of the electronic tester 10 to turn on or turn off a data list for the Cadence operating system for analog testing of device under test 50. The data list is similar to the data log, except that the data list takes the binary measurement information and puts that information in a format more understandable to the user of electronic tester 10.

Button number 228 of operator tool 160 allows the user to turn on or turn off the enVision++ data log. When the enVision data log is turned on, the measurements made during digital testing of DUT 50 are written to a file.

Area 239 of operator tool 160 is used to display status. For example, the status may be that the program is loading.

Figure 9:
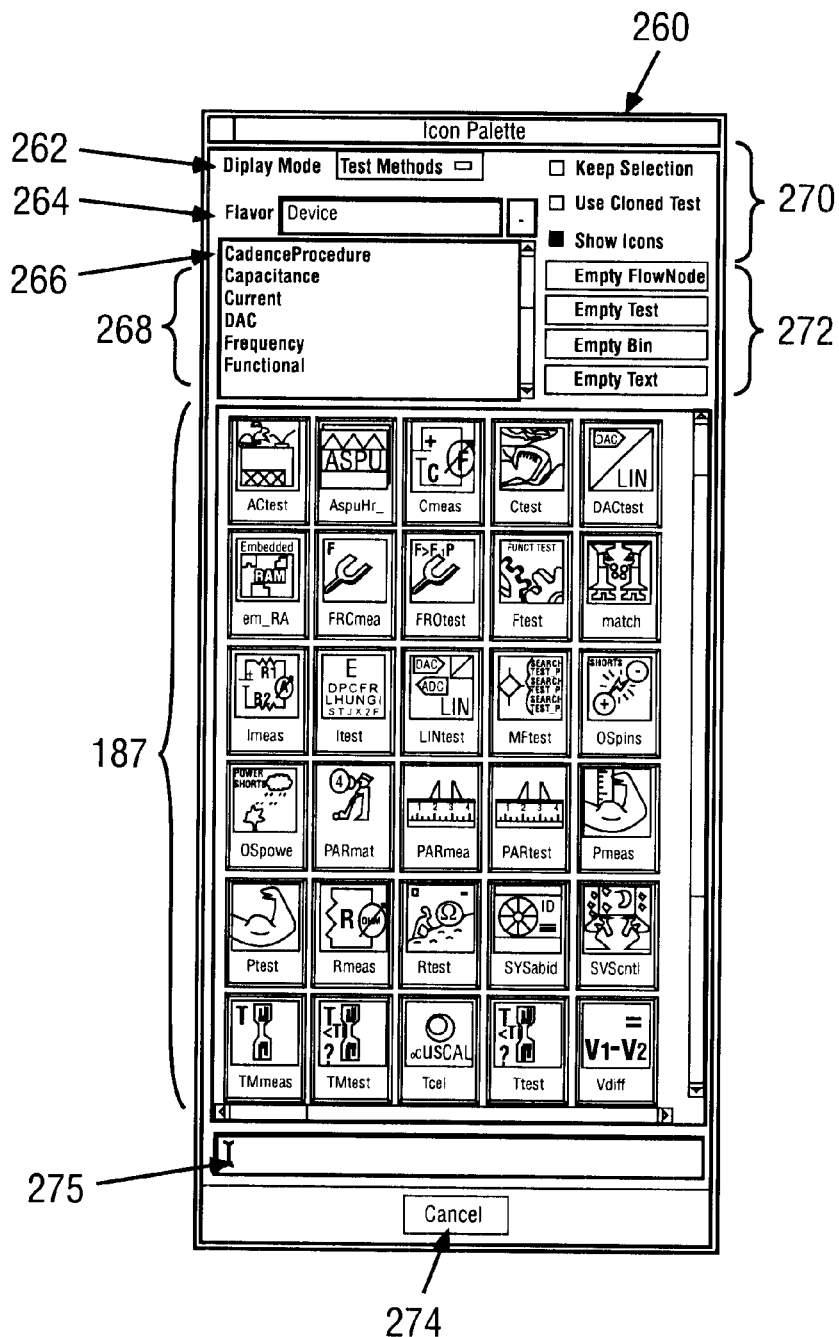
FIG. 9 shows the graphical user interface for the icon palette of test methods for the electronic tester.

FIG. 9 shows the icon palette 260 for displaying test method icons and the Cadence procedure icon. A test method is a procedural function written in C++ developed to perform a certain test or class of tests on the device under test 50. Icon palette 260 shows the icons for the test methods 187. These test methods 187 are complete and designed with necessary debug and characterization options.

The library of test methods includes opens and shorts ("OSpins"), power supply opens and shorts ("OSpower"), input leakage ("Itest"), output leakage ("Itest"), tristate leakage ("Itest"), current measurement ("Imeas"), functional test ("Ftest"), dynamic input voltages ("PARtest"), dynamic output voltages ("Vtesf"), dynamic output currents ("Itest"), power supply margin ("PARtest"), timing verification ("PARtest"), static supply current ("Ptest"), dynamic supply current ("Ptest"), supply current measurement ("Pmeas"), capacitance ("Ctest, Cmeas"), resistance ("Rtest, Rmeas"), voltage match ("Vmatch"), voltage differences ("Vdiff"), current match ("Imatch"), frequency ("FRQtest, FRQmeas"), and parameter match ("PARmatch").

Icon palette 260 includes a display mode 262 pull down menu for choosing the test methods 187 as the display. Icon palette 260 includes a line 264 for specifying the type of test method.

Line 266 of icon palette 260 allows the user to choose a Cadence procedure for display. The Cadence procedures are used for analog testing of DUT 50. Clicking mouse 49 on the Cadence procedure line 266 causes icon palette 260 to display a Cadence procedure icon.

Controls 268 allow the user to choose a test method. Controls 270 allow the user to keep the selection, use a cloned test, or show the icons for the test methods. Controls 272 allow the user to empty the flow node, empty the test, empty a bin, or empty text. Button 274 allows the user to cancel the display of the icon palette.

Area 275 displays status.

Figure 10:
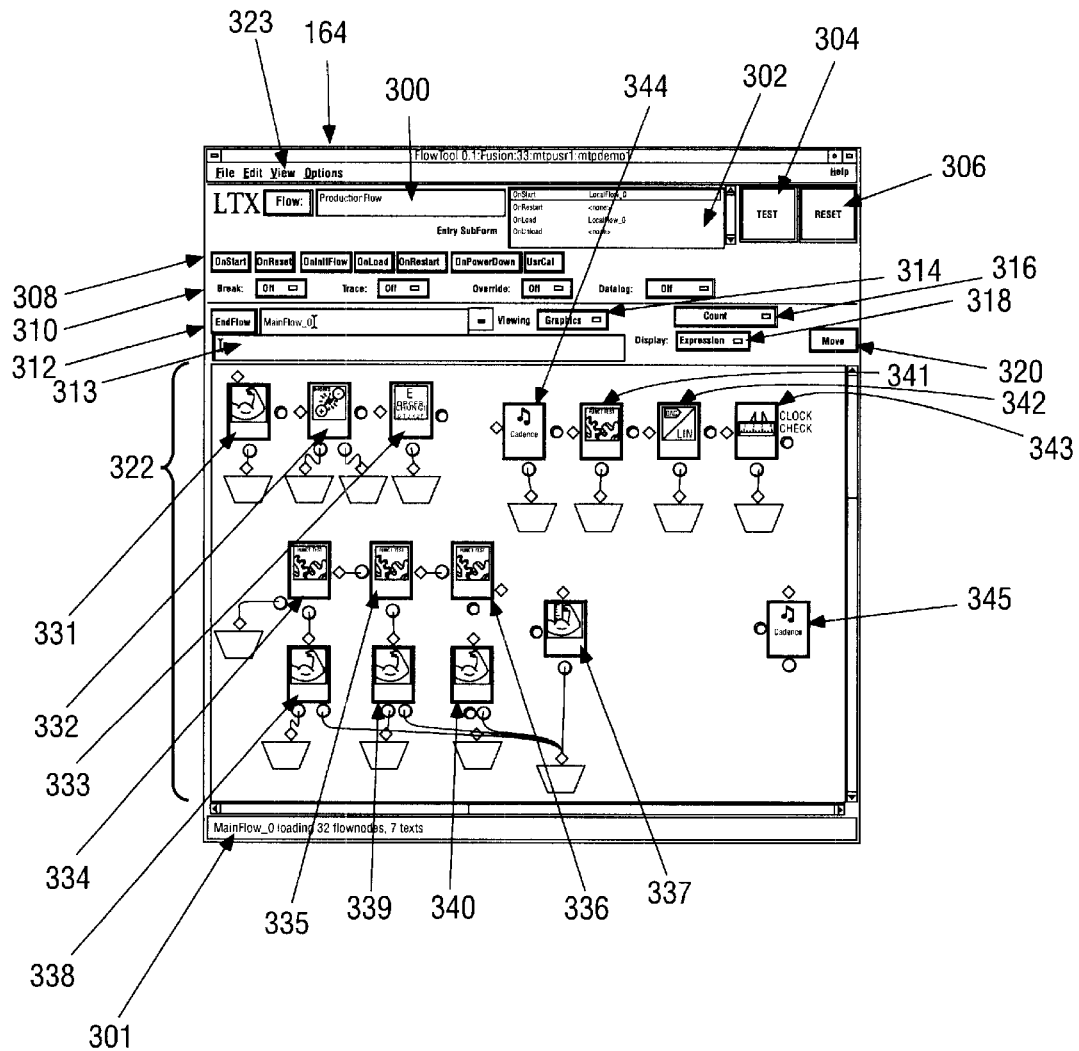
FIG. 10 shows the graphical user interface of the flow tool of the electronic tester.

FIG. 10 shows the graphical user interface for flow tool 164. Flow tool 164 provides a graphical representation of program flow. The graphical representation of program flow is similar to a flow chart for software. Flow tool interface 164 includes display portion 322 for displaying program flow. The program flow displayed is the sequence of operation of the overall program. Each node in the flow display 322 may be a test, a bin, an entry point, or a subflow identifier.

Tests are selected from the Cadence procedures (for analog tests) and the library 187 of test methods (for digital tests). The library may also be extended by the user with user additions 189. The test flow may be developed hierarchically by means of subflows.

The test node may have a simple two-way output based on past/fail, or have a multiple way output decision based on the results of the test. Each output is represented on the flow with a port designator. The decision that causes this port to be traversed is defined by test tool 166.

Display 322 of flow tool 164 shows a demonstration display that includes digital test methods 331 through 343. Display 322 also shows icons 344 and 345 for Cadence procedures for doing analog testing of DUT 50. Cadence procedures are written in the Cadence language. Cadence procedure 344 is an AC/DC test with respect to DUT 50. Cadence procedure 345 is a process array analog test with respect to DUT 50. As shown in FIG. 10, the various test methods and Cadence procedures shown in display 322 are linked by lines showing program flow.

The program flow shown in display area 322 can be altered graphically by a user by using mouse 49. Altering the program flow in display 322 in turns alters the actual program flow. In other words, a user of electronic tester 10 can use mouse 49 to rearrange icons, add and delete icons, rearrange lines of program flow, and add and delete lines of program flow in display 322, which in turn alters the actual program flow.

Line 300 of flow tool 164 allows the user to specify what program flow the user wishes to have displayed. Menu 302 allows the user to specify entry subflows. Buttons 308 allow the user to specify on start, on reset, on initial flow, on load, on restart, on power down, and user calculation.

Buttons 310 allow the user to specify whether the following items should be turned on and off: break, trace, override, and datalog. Line 312 allows the user to specify subflow. Button 314 allows the user to specify the viewing of graphics. Button 316 allows the user to specify the count. Button 318 allows the user to display an expression. Button 320 allows the user to specify the move option that allows the user to move from area to area within display 322.

Button 304 allows the user to begin a test by clicking on button 304. Button 306 is a reset button.

When a user clicks mouse 49 on an icon of display 322, text or a formula associated with that icon appears in area 313. In addition, if the user uses the pull down menu called view 323 to display information, such as the length of a test, that information is displayed in area 313. Area 301 is used to display status.

Figure 11:
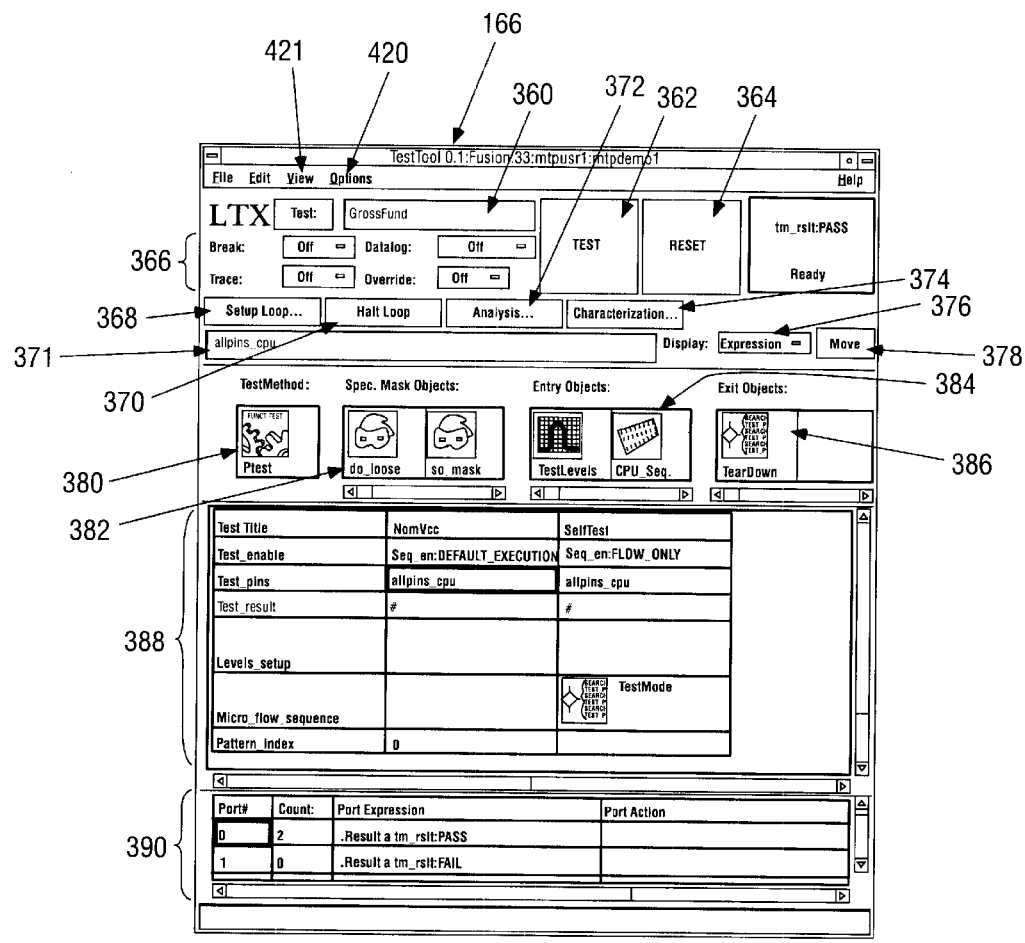
FIG. 11 shows the graphical user interface of the test tool for the electronic tester.

FIG. 11 shows the graphical user interface for test tool 166. Test tool 166 is a testing tool that a test engineer uses to develop and fine tune a test program. Test tool 166 provides the user with specific details of each test.

Test tool 166 provides an interface with respect to both the digital C++ test methods and the Cadence procedures for analog testing.

Test tool 166 allows the user to specify the setup and exit conditions that are to be stored in a particular test object. The setup and exit conditions are used whenever a test flow (as determined by the flow object) requires that a test be executed.

Line 360 of test tool 166 allows the user to specify a test. Button 362 allows the user to begin the test. Button 364 allows the user to reset the test. Buttons 366 allow the user to specify whether the following controls should be turned on or off: break, trace, datalog, and override.

Button 368 allows the user to set up a loop for looping a test method or Cadence procedure. Button 370 allows the user to halt the looping of a test method or Cadence procedure. For one embodiment, button 372 allows the user to specify an analysis of the test method or Cadence procedure. For one embodiment, button 374 allows the user to characterize the test method or the Cadence procedure. For one alternative embodiment, button 372 allows the user to specify an analysis of a test method but not a Cadence procedure, and button 374 allows the user to characterize a test method but not a Cadence procedure.

Display 380 specifies the test method or Cadence procedure that is being analyzed by the test tool 166. Display 382 of test tool 166 displays the spec/mask objects defining the parameters to be used.

Display 384 displays the entry objects. The entry objects, which are also called the setup objects, are to be loaded prior to execution of the particular test method or Cadence procedure. Display 386 displays the exit objects. Upon completion of the test method or Cadence procedure, the exit objects are loaded to establish the appropriate reset or idle state for the device under test 50. All tester 10 functions that are not specified in either the set-up or entry objects will be left unchanged.

Clicking on a test method icon or a Cadence procedure icon allows the user to select the display of the source code associated with the test method or the Cadence procedure.

Area 388 of test tool graphical user interface 166 is a separate area for the definition of the input and output parameters of the test method or Cadence procedure. The names and types of these parameters are defined by the test method or Cadence procedure. These parameters may be either constant values (for example, 5.25 volts), parameter values directly from the spec object (for example, Vcc), or expressions made up of constants and parameter values (for example, (Vcc−10%)+500 millivolts).

Area 371 is used to display information requested by using the pull down menu called view 421. Area 371 also has other uses. If the user clicks mouse 49 on one of the cells or boxes within display area 388, the full text associated with that cell appears in area 371. If the user indicates a cell within display area 388 by using mouse 49 and then writes test in area 371, then hitting the return key causes that text to be written to the respective cell within display area 388.

Clicking on move button 378 with mouse 49 causes the displaying of arrows that allow a user to move from cell to cell within display area 388.

Button 376 toggles between "expression" and "value." When "expression" is selected using button 376, a formula is shown in the respective cell selected within area 388. When "value" is selected using button 376, a result of that formula—i.e., a value—is shown in the respective cell selected within area 388.

Button 372 is used for controlling debugging. Button 374 is used for controlling the characterization options with respect to the test method or Cadence procedure.

Area 390 of test tool graphical user interface 166 is for exit port expressions. Test tool 166 defines the exit port expressions. A list of expressions is evaluated in sequence. When a true condition is encountered, the associated port will be chosen. The exit ports are not part of the test method or Cadence procedure. Decisions are generally based on a pass/fail flag from the test method (or Cadence procedure) or based on comparisons to measurements on the DUT 50.

Figure 12:
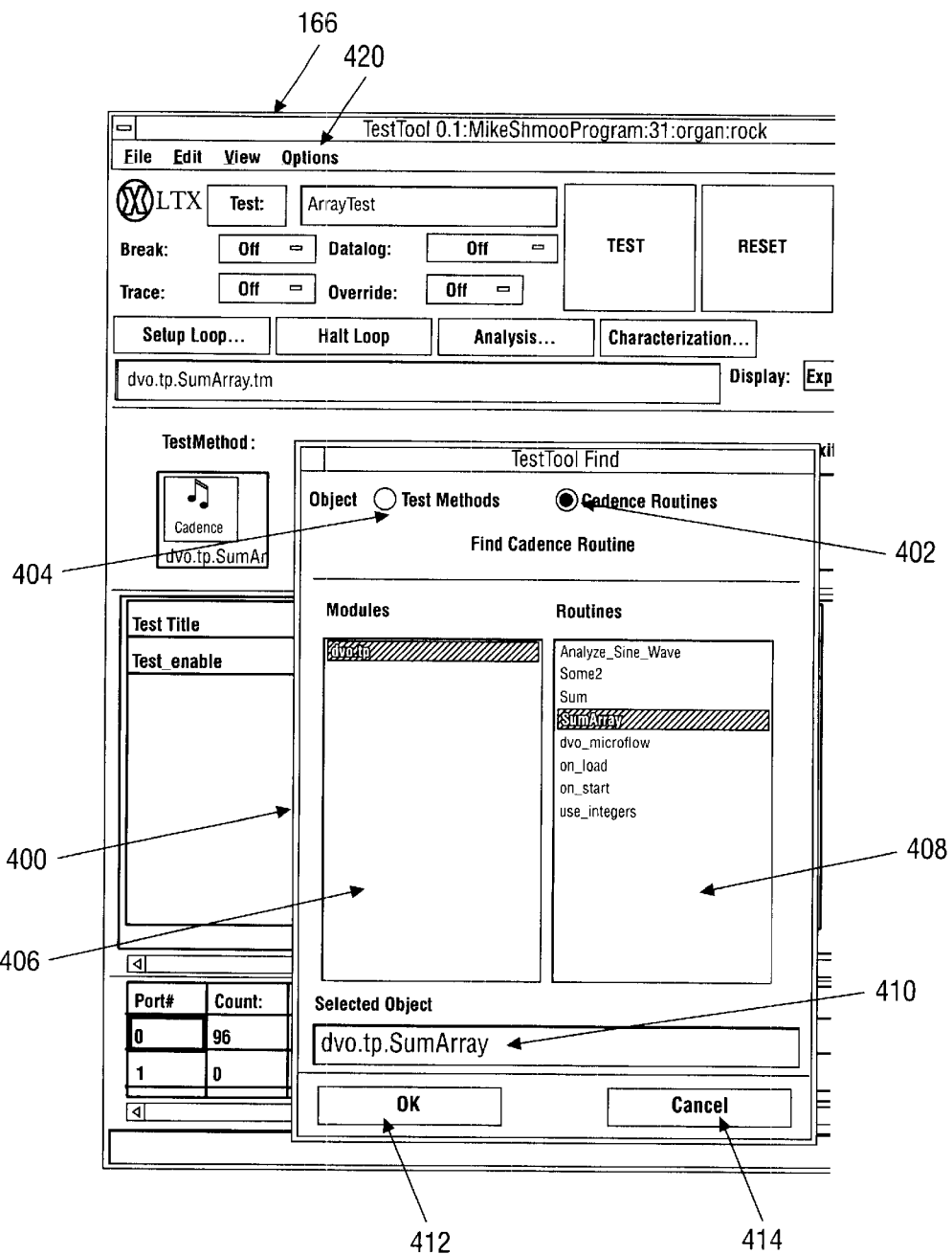
FIG. 12 shows the graphical user interface of the find feature of the test tool for the electronic tester.

FIG. 12 shows how to call a Cadence procedure (for analog testing) from the test tool 166. Test tool 166 includes a test tool "find" function 400. The test tool "find" window 400 can be displayed by choosing the "find" function from the options pull-down menu 420.

When the test tool find window 400 is chosen using the options pull down menu 420, the test tool find window 400 appears on the cathode ray tube 46 of network interface computer 14. The test tool find window 400 allows the user to locate test methods by pressing button 404 or locate Cadence routines by pressing button 402. In FIG. 12, the Cadence routines button 402 was selected. The names of the Cadence modules are displayed in area 406. A Cadence module is a file. There can be multiple Cadence procedures within a Cadence module. The Cadence routines are displayed in area 408 of test tool find window 400. The selected object is displayed on line 410 of test tool find window 400. The user can click on button 412 to indicate that the Cadence routine specified should be displayed and called. The user can cancel the display of the test tool find window 400 by pressing button 414.

For one embodiment, Cadence routines lack the following features associated with digital test methods: multisite support, analysis support, characterization support, help/documentation, and argument comments. Moreover, for that embodiment, the Cadence routines have not been designed and tested to be general. For an alternative embodiment, Cadence procedures include multisite support, analysis support, characterization support, help/documentation, argument comments, and have been designed and tested to be general.

Figure 13:
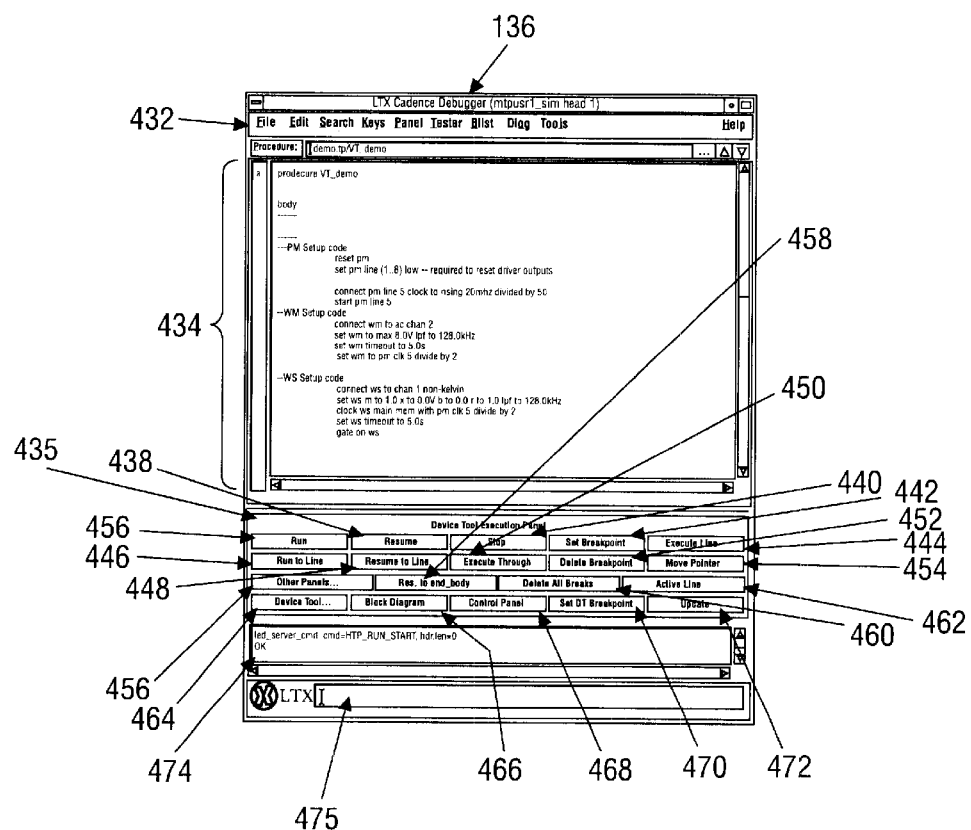
FIG. 13 shows the graphical user interface for the editor and debugger of the electronic tester.

FIG. 13 shows the graphical user interface for the editor and debugger compiler 136 for the network interface computer 14. The editor and debugger compiler 136 is also called Cadence debugger 136.

Cadence is a full featured line-by-line compiled test language designed specifically for writing and debugging of Cadence procedures for analog testing of device under test 50.

The Cadence debugger 136 helps to eliminate the time consuming edit/compile/link/restart process. With the Cadence debugger 136, the test engineer can stop at any line in the Cadence test program, change any line of code, and continue debugging.

The Cadence debugger 136 is supported by tools that guide the test engineer through the development process, including instrumentation syntax, a library of DSP functions, graphical status displays, instrument control panels, and DSP waveform displays.

The Cadence debugger graphical user interface 136 appears on the screen 46 of network interface computer when the test engineer clicks mouse 49 on a Cadence procedure icon or object, such as Cadence procedure icon 344 shown in FIG. 10. The Cadence debugger 136 shown in FIG. 13 then appears on screen 46 of network interface computer 14, which allows the test engineer to view, debug, or execute the Cadence test procedure.

Pull down menus 432 on the Cadence debugger 136 allow the test engineer to choose various options regarding file, edit, search, keys, panel, tester, data list, data log, and tools.

Area 434 of graphical user interface 136 displays the Cadence source code, which allows the user to edit, debug, or simply view the source code.

Triggers and break points are supported by the Cadence debugger 136. Triggers and break points serve multiple purposes on electronic test system 10. One application is to provide a mechanism for debugging a test program. A second application is to provide a mechanism for analyzing or debugging device under test 50. A third application is to provide a means of collecting (or disabling collection of) data from device under test 50. All of these uses are also supported by the operator tool 160 of FIG. 8, which includes trigger and break point tools found in pull down menu 248 and break button 234.

The user of electronics tester 10 may select from a variety of trigger events, and upon the event occurring, may either suspend execution or perform some operation to continue. Triggers and break points can be enabled and disabled as needed.

The execution panel 435 of Cadence debugger 136 allows the user of test system 10 to call enVision++ test methods and other routines. One way is to execute an enVision++ object. One function call can execute nearly any enVision++ object. Another way is by executing an enVision++ ETIC. "ETIC" stands for enVision ++ tester interface class. An ETIC is the interface between enVision ++ and the hardware of electronic tester 10. ETICs are built into the Cadence operating system and are called in a Cadence like syntax. The other way is to get the value of an enVision++ expression. In short, Cadence and enVision ++ can share data and can communicate with each other. For one embodiment, enVision ++ test methods, routines, and data can be called from Cadence only if both enVision ++ and Cadence are loaded.

The run button 436 of Cadence debugger graphical user interface 36 shown in FIG. 13 causes the Cadence source code to execute. Resume button 438 causes the Cadence source code to resume execution. Step button 440 allows the test engineer to step through a Cadence routine. Button 442 of Cadence debugger 136 allows the test engineer to set a break point for the Cadence source code.

Button 444 of Cadence debugger 136 allows the test engineer to execute a single line at time of the Cadence source code. Button 446 of Cadence debugger allows the test engineer to run the Cadence program up to a specific line.

Button 448 allows the user to resume to a line. Button 450 allows the test engineer to let the Cadence program execute through a specific break point. Button 452 allows the test engineer to delete a break point. Button 454 allows the test engineer to move a pointer. Button 456 allows the user to view other panels. Button 458 allows the user to resume to the end body. Button 460 allows the user to delete all break points. Button 462 allows the user to view an active line. Button 464 allows the user to view the device tool. Button 466 allows the user to view a block diagram. Button 468 allows the user to view a control panel. Button 470 allows the user to set a DT break point. Button 472 allows the user to update.

Area 474 of Cadence debugger is an echo-back panel that displays text or status. Area 475 of Cadence debugger 136 is a command line for the user to execute commands with respect to execution panel 435.

Figure 14:
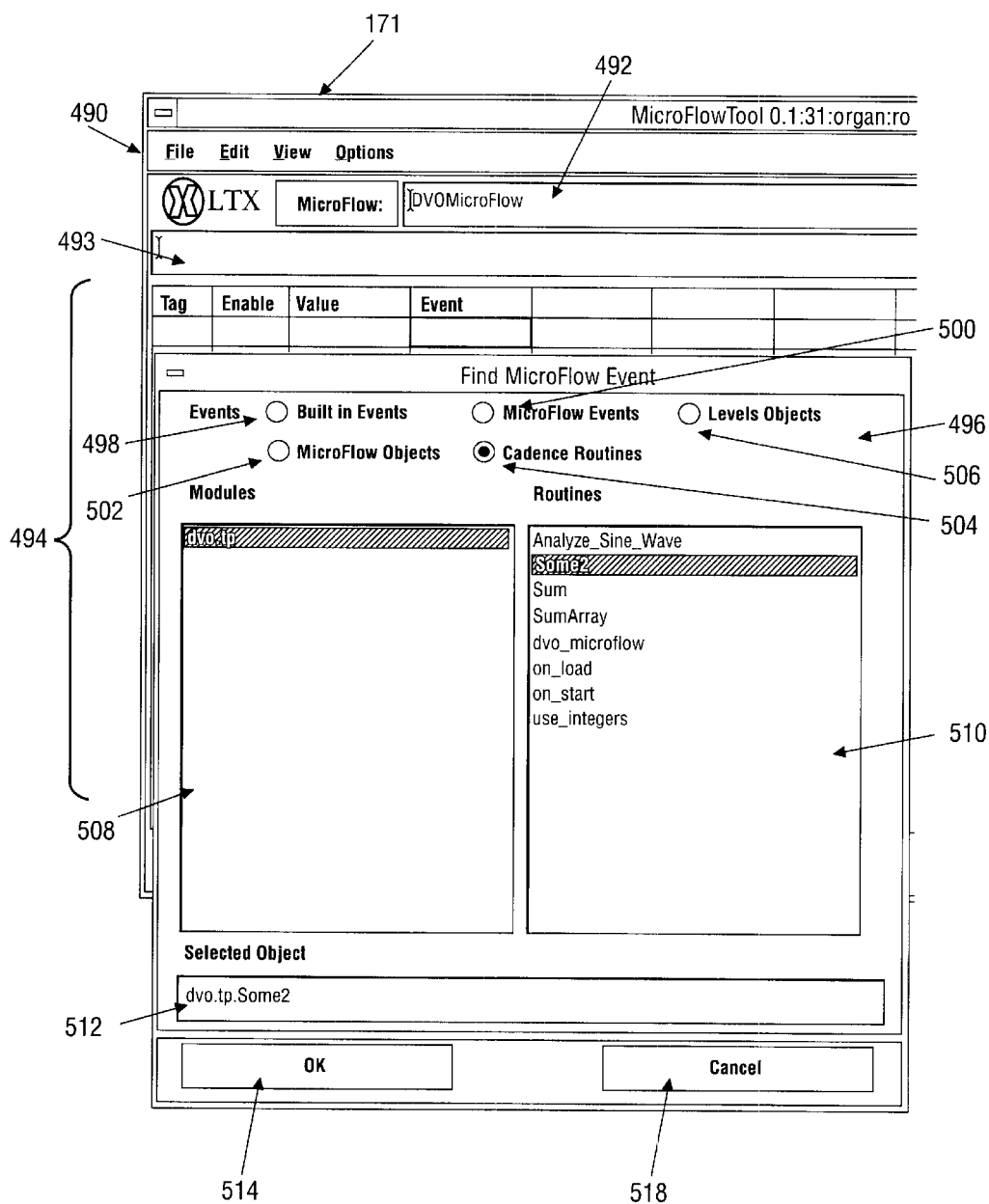
FIG. 14 shows the graphical user interface for selecting an analog software routine from the microflow tool of the electronic tester.

FIG. 14 shows a portion of the microflow tool graphical user interface 171 of electronic tester 10 that demonstrates that Cadence routines can be called from the enVision++ microflow tool 171. Microflow tool 171 is the interface between the user and a microflow object and is the user's view into the microflow object. This provides testing capabilities that are useful during the debug of each microflow.

A test engineer writes a microflow object when the test engineer wants to deviate from a test method. A microflow object can be called from a test method, such as from one of test methods 187. The microflow object is invoked to perform the additional functions that the test engineer wants that are not provided by the test method.

To view microflow objects, the user of electronic tester 10 can launch the microflow tool 171 from the tools menu 248 of operator tool 160. For the user to actually test the device under test 50 in the context of a single test, the user starts microflow tool 171 by examining one of the microflow object icons in test tool 166.

During the debug phase of a test program, the microflow tool 171 is used to trace the low-level hardware functions calls executed by the test/microflow objects up to the break point, and to reexecute that sequence after manual changes are made by the user. For the latter, the microflow tool 171 can be used to perform temporary changes, or to support the debug of the test program or device under test 50.

Controls 490 of microflow tool 171 allow the user to select the file, edit, view, and options pull-down menus. Display area 492 shows the name of the microflow object being displayed. Area 493 is used to display information selected from the view menu of area 490, or to display and alter text with respect to a cell from area 494.

Not shown in FIG. 14 are the buttons for execute, value, and move controls for microflow tool 171. Also not shown in FIG. 14 is a help menu for microflow tool 171.

Display area 494 of microflow tool 171 allows the display of information with respect to the microflow object, including tag, enable, value, and event.

Window 496 for finding a microflow event can be displayed by using the pull down menu of the options command 490 of microflow tool 171. Button 498 allows the user to select built in events. Button 500 allows the user to choose microflow events. Button 506 allows the user to select levels objects. Button 502 allows the selection of microflow objects.

Button 504 allows the user to select Cadence routines.

Area 508 allows the display of names of modules. Area 510 allows the display of names of routines. In FIG. 14, the Cadence routines are selected and the names of the Cadence routines are shown in area 510.

Area 512 allows the display of a selected object. Button 514 allows the user to agree to the finding of a particular microflow event. A button 516 allows the user to cancel the finding of a particular microflow event.

Figure 15:
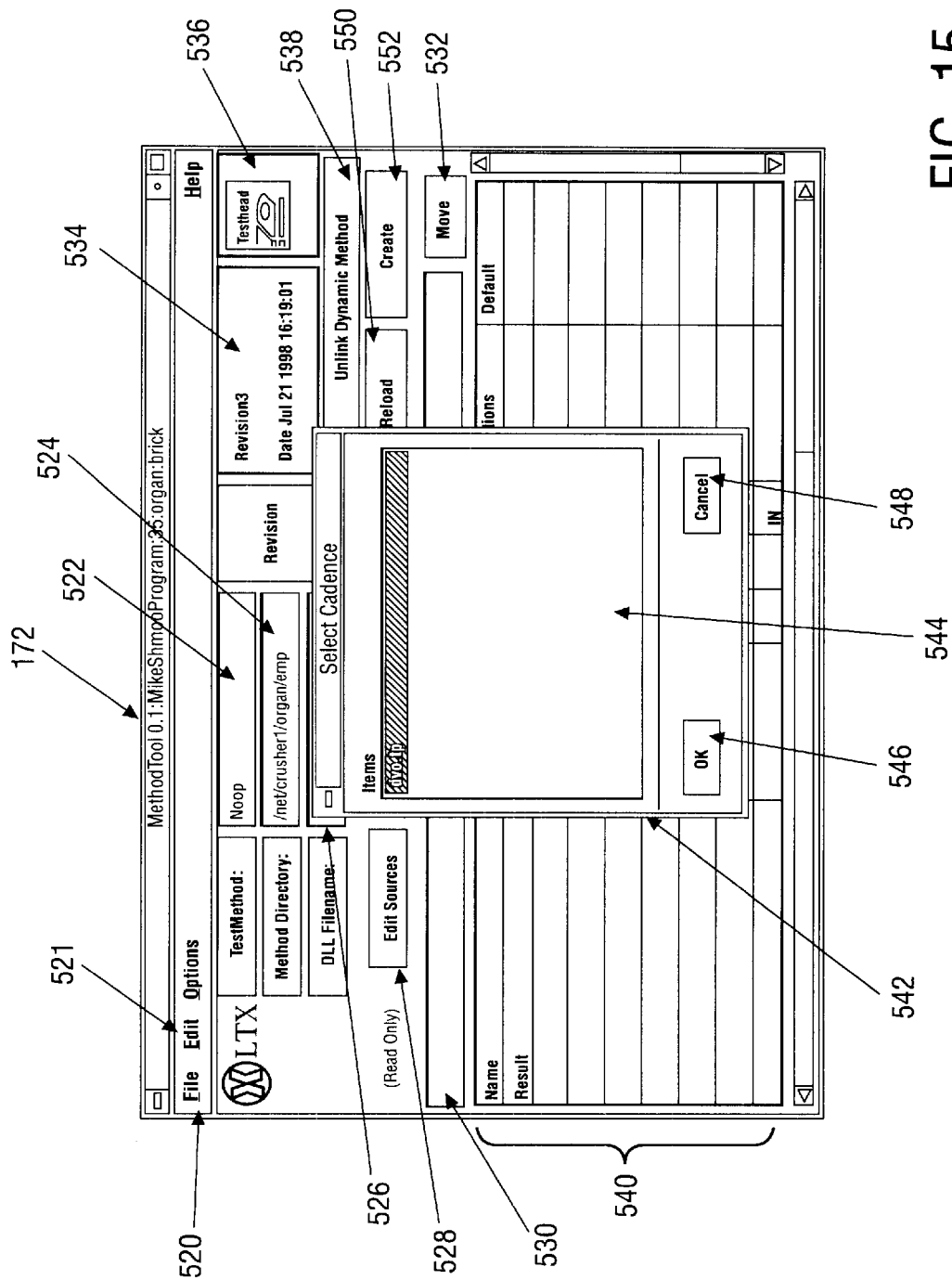
FIG. 15 shows the graphical user interface for finding an analog software routine from the method tool of the electronic tester.

FIG. 15 shows a portion of the method tool graphical user interface 172. Method tool 172 is used for viewing, modifying, creating, or debugging test methods, user functions, data log formatting routines, microflow event methods, or external interface methods. Pull-down menus 520 allow the user to select file, edit, and options routines.

The test method that is subject of the method tool is set forth in line 522. An icon for the test method is shown in box 536. The revision information regarding the test method is shown in box 534. The directory for the test method is specified in line 524. The dynamically linked library ("DLL") file name is specified in line 526. Button 538 is a button for unlinking the dynamic method. Button 528 is for editing sources. Button 538 is for reloading. The build button (not shown) will compile the source file to executable object file. Button 552 is for creating a test method. Entering a command in line 530 and pressing move button 532 allows the user to move to another portion of the enVision++ executive system 130 and out of method tool 172. Area 540 of the method tool graphical user interface of method tool 172 shows information regarding the method tool such as argument definition.

Cadence procedures can be selected from within the method tool graphical user interface 172. The select Cadence window 542 that can called from method tool 172 allows a user to select a Cadence module.

The select Cadence window 542 is useful because Cadence modules can be called from C++ test method. The method tool 172 is useful for developing C++ test methods. If a Cadence module is to be called from a test method, the select Cadence window 542 is useful in selecting which Cadence procedure to call.

To select a Cadence module, the user clicks mouse 49 on the edit pull-down menu 521 and chooses the Cadence modules command. The result of this is that window 542 appears on CRT 46 of network interface computer 14. Area 544 of window 542 lists the names of the Cadence modules that can be selected. The user can select a Cadence module by highlighting the module with mouse 49 and by hitting OK button 546. To cancel a selection of a Cadence module, the user hits the cancel 548 button with mouse 49.

If the Cadence module is selected by hitting OK button 546, then method tool 172 automatically generates the code to allow a test method written in C++ to call a Cadence module. The test engineer can then select the callable Cadence procedures from within the Cadence module.

Figure 16:
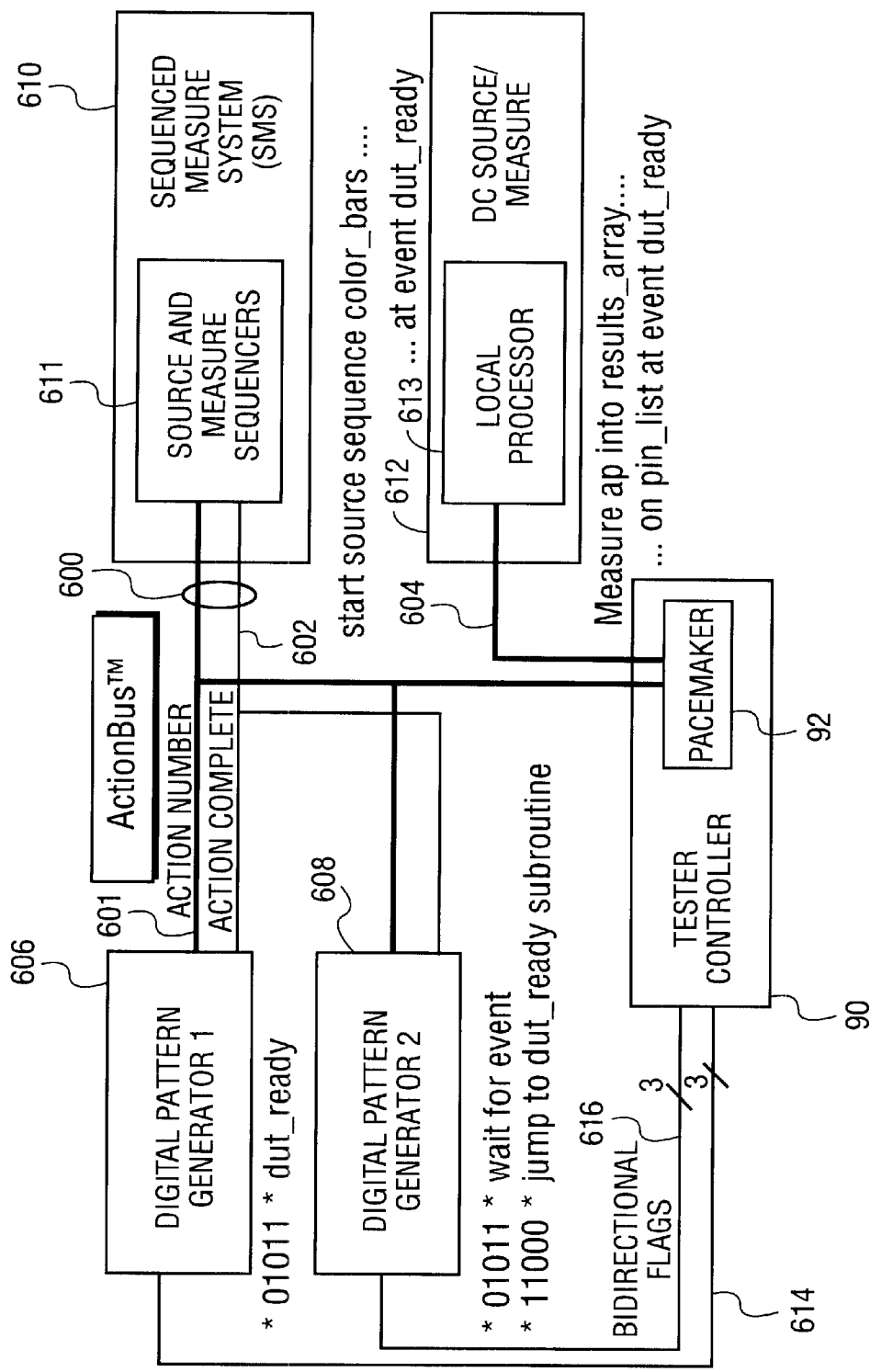
FIG. 16 illustrates the action bus architecture of the electronic tester.

FIG. 16 shows the architecture of the electronic tester 10 with respect to the action bus™ 600. Action bus 600 is also referred to as marker bus 600. Action bus 600 allows the synchronization of events among all the instructions for precision control of each test. Action bus 600 allows the electronic tester 10 to have modular architecture. Modularity means that a test engineer can replace one part of electronic tester 10 and electronic tester 10 will still work.

Action bus 600 comprises action number bus 601 and action complete bus 602. Action number bus 601 is used to send markers (also called action numbers or action time stamps) to initiate action by the modular circuitry within electronic tester 10. Action number bus 601 is also referred to as action marker bus 601 and action timestamp bus 601.

Action complete bus 602 sends action complete markers also called action complete numbers, action complete time stamps, or acknowledgements that indicate to the modular circuitry that the action requested has been completed. Action complete bus 602 is also called action complete number bus 602 or action complete time stamp bus 602. For one embodiment, action number bus 601 is 16 bits wide and action complete bus 602 is one bit wide.

Action number bus 601 is coupled to digital pattern generator 606, digital pattern generator 608, source and measure sequencers 611 of sequenced measure system ("SMS") 610, and pacemaker 92 of tester controller 90. Pacemaker 92 is in turn coupled to local processor 613 of DC source/measure instrument 612 via bus 604.

Action complete bus 602 is coupled to digital pattern generator 606, digital pattern generator 608, and source and measured sequencers 611 of sequenced measure system 610.

Bidirectional flag line 614 is coupled between digital pattern generator 606 and tester controller 90. Bidirectional flag line 616 is coupled between digital pattern generator 608 and tester controller 90.

Digital pattern generator 606 is a custom processor that acts as a sequencer. Digital pattern generator 606 is used to generate digital test vectors for testing device under test 50. Digital pattern generator 606 can drive 1,024 pins of the device under test 50 in parallel. Digital pattern generator 606 thus generates digital test vectors for digital testing of a device under test 50. Digital pattern generator 606 is microcoded and includes assembly code executed by clock steps. Test engineers write the digital test vectors in order to test device under test 50. Digital pattern generator 606 is clocked by a clock generator.

Digital pattern generator 608 is similar to digital pattern generator 606. Digital pattern generator 608 is used to send digital test vectors to the device under test 50 but sends those digital test vectors to different pins of the device under test than digital pattern generator 606. Digital pattern generator 606 and 608 can send test vectors at different times to different pins of device under test 50.

Sequenced measure system 610 includes source and measure sequencers 611. Sequenced measure system 610 is used for analog testing of the device under test 50. The sequenced measure system 610 is controlled by pacemaker 92, which in turn is controlled by tester controller 90.

The sequenced measure system 610 is the DSP source and measurement system of electronic tester 10. Sequenced measure system 610 provides test capability for audio, video, datacom, and telecom type devices under test 50.

For one embodiment, the sequenced measure system 610 features analog performance from DC to 100 megahertz and local DSP processing that eliminates data transfer through the tester 10. One high speed version of sequenced measure system 610 contains analog circuitry optimized for analog waveform operations up to 100 megahertz. That high speed version is intended for applications such as MPEG video devices, high speed data converters, and DVD read channels.

For an alternative embodiment, a high resolution version of sequenced measure system 610 uses analog circuitry optimized for lower frequency and higher precision operations. The high resolution version of sequenced measure system 610 is suited for applications such as audio circuits, high resolution data converters, ISDN, and ADSL. The sequenced measure system 610 includes a event processor and a controller/processor. Sequenced measure system 610 is clocked.

DC source/measure unit 612 is used for DC source and measure with respect to device under test 50. The DC source and measure operations done by DC source/measure unit 612 are analog tests with respect to device under test 50. DC source/measure unit 612 includes a local processor 613. DC source/measure unit 612 is controlled by pacemaker 92, which in turn is controlled by tester controller 90. For an alternative embodiment, DC source/measure unit 612 is directly connected to action bus 600.

Digital pattern generators 606 and 608 communicate with tester controller 90 via respective bidirectional flag lines 614 and 616. For example, digital pattern generators 606 and 608 can use bidirectional flag lines 614 and 616 to interrupt. Tester controller likewise can send signals to digital pattern generator 606 and 608 via bidirectional flag lines 614 and 616. For example, tester controller 90 can use bidirectional flag lines 614 and 616 to request the digital pattern generators 606 and 608 to start generating patterns.

The action number bus 601 works as follows. A test engineer places up to 4,096 markers in a digital pattern produced by digital pattern generator 606 to mark specific actions that need to occur elsewhere in tester 10. Each marker causes digital pattern generator 606 to send a marker over action number bus 610 to sequenced measure system 610 and pacemaker 92. Digital pattern generator 606 can also be used to place markers in a pattern where analog events need to occur by importing mixed mode patterns from automated program generation tools. Such mixed mode patterns contain flags indicating that analog events are to occur.

Digital pattern generator 608 can also send out markers on action number bus 601 at appropriate times to cause SMS 610 and pacemaker 92 to initiate action.

When a marker appears on action number bus 601, pacemaker 92 can respond to the marker by sending a signal on line 604 to initiate action by DC source/measure unit 612.

Digital pattern generator 606 can be the master at times. As bus master, digital pattern generator 606 can send markers over action number bus 601 to source and measure sequencers 611 and pacemaker 92. Digital pattern generator 608 can also receive a marker from action number bus 601 in response to digital pattern generator 606 sending out such a marker. Thus, digital pattern generator 608 can be a slave. At other times, digital pattern generator 608 can be the bus master and send out markers to source and measure sequencers 611, pacemaker 92, and digital pattern generator 606.

For one embodiment, source and measure sequencers 611, DC source/measure unit 612, and pacemaker 92 are always slaves and never the masters with respect to markers on action number bus 601. For alternative embodiments, source and measure sequencers 611, DC source/measure unit 612, and pacemaker 92 can be masters and send markers on action number bus 601 to digital pattern generators 606 and 608 and to other circuitry coupled to action number bus 601.

An example illustrates how action number bus 601 works. A test engineer working on electronic tester 10 may, for example, want to send a DC source of 5 volts to the device under test 50 at 500 milliseconds into a test. The test engineer puts a command in digital pattern generator 606 for digital pattern generator 606 to send out a marker on action number bus 601 when the 500 millisecond point has been reached with respect to the generation of test vectors by digital pattern generator 606. For this example, digital pattern generator 606 is acting as the master with respect to the action number bus 601. The digital pattern generator 606 puts a marker on action number bus 601 when the 500 millisecond point is reached. Pacemaker 92 receives the marker at this point and sends a command over line 604 to prompt the local processor 613 to cause the DC source/measure unit 612 to set the DC source with respect to a pin on the device under test 50 to 5 volts. Sequenced measure system 610 would also see the marker placed by digital pattern generator 606 on action number bus 601 and perform a source test at that same point with respect to another pin of the device under test 50.

Accordingly, it should be appreciated that the action bus 600 arrangement allows the sequenced measure system 610 and the DC source/measure unit 612 to act locally. The digital pattern generator 606 can simply trigger action that will be done by the sequenced measure system 610 and the DC source/measurement unit 612. This allows the electronic tester 10 to in effect think globally and act locally.

For an alternative embodiment of the invention, a pulsed power source (described in more detail below) can also be coupled as a slave to action bus 600.

For an alternative embodiment, a power voltage/current ("PVI") unit can also be coupled as a slave to action bus 600 via pacemaker 92 and line 604. For yet another alternative embodiment, a PVI unit is directly connected to action bus 600.

When sequenced measure system 610 receives a marker from action number bus 601, sequenced measure system 610 knows what actions to take with respect to analog testing of device under test 50. Sequenced measure system 610 has processing circuitry that triggers particular tests in response to the receipt of markers from action number bus 601. Likewise, DC source/measure unit 612 also knows what particular actions to take when it receives a prompting from pacemaker 92 triggered by pacemaker 92 receiving a marker on action number bus 601.

The source and measure sequencers 611 of sequenced measure system 610 can send an action complete marker over action complete bus 602 to digital pattern generator 606 or digital pattern generator 608 indicating that a particular action requested has been completed. Digital pattern generators 606 and 608 can also send an action complete marker from the slave to the master acknowledging the completion of a task by a slave. Indeed, any slave with respect to action bus 600 can send action complete markers over action complete bus 602.

For one embodiment of the present invention, a marker on action number bus 601 appears as the binary number 01011. For one embodiment, the compiler for digital pattern generators 606 and 608 compiles that pattern as a "DUT_ready" command. For that embodiment, a "DUT_ready" command is written in the source code for digital pattern generators 606 or 608 at appropriate points where the test engineer wishes a marker to be sent on action number bus 601 to trigger action by a slave, such as the SMS 610.

As an example, if digital pattern generator 606 sends out a marker at a "DUT_gready" command, the sequenced measure system 610 starts a source sequence of color bar measurement with respect to DUT 50 when the marker is received by sequenced measure system 610. As another example, the marker may trigger the DC source/measure unit 612 to measure a pin of device under test 50 and put the measurement into a results array on a pin list.

As discussed above, electronic tester 10 includes both circuitry for doing digital testing of DUT 50 and circuitry for doing analog testing of DUT 50. The discussion below in connection with FIGS. 17–21 describes the digital test circuitry in more detail. The discussion below in connection with FIGS. 22 and 23 discusses certain analog test circuitry in more detail.

Figure 17:
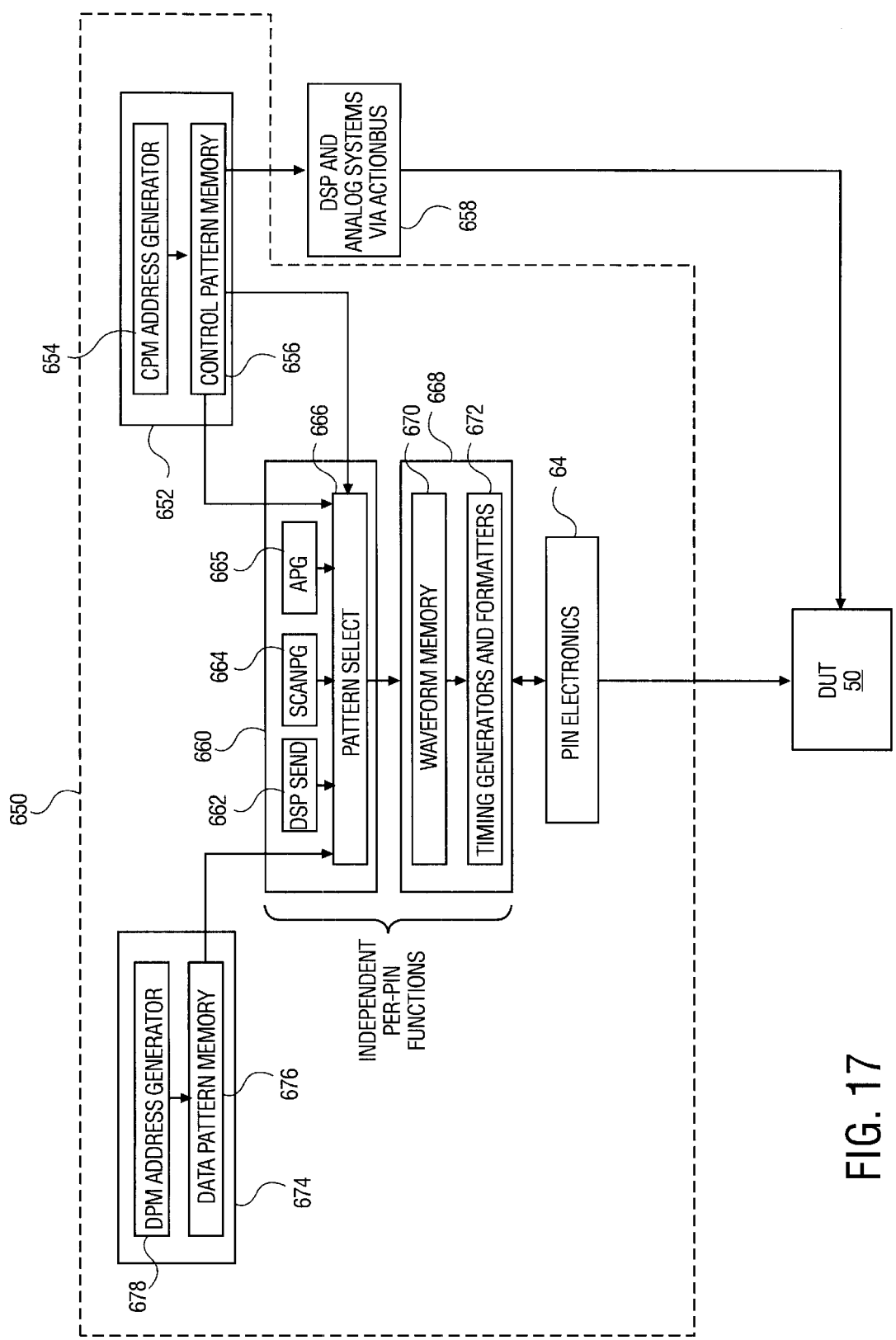
FIG. 17 is a block diagram of digital test circuitry of the electronic tester.

FIG. 17 shows digital subsystems 650 for testing the device under test 50 in a digital manner. Digital subsystem 650 includes control pattern processing unit 652; data pattern processing unit 674; pattern select processing unit 660; waveform, timing, and formatter unit 668; and pin electronics cards 64.

Digital subsystem testing unit 650 is coupled to the device under test 50. Pin electronics cards 64 are located in test head 16 and coupled to device under test 50. For an alternative embodiment, pin electronics cards 64 are also coupled to a second device under test coupled to a second test head 18. The rest of digital subsystem testing unit 650 besides pin electronics 64 resides within digital circuitry 20 (shown in FIG. 1) and digital resources 94 (shown in FIG. 3). The entire digital subsystem 650 resides within digital boards 64 (shown in FIG. 4).

Control pattern processing unit 652 shown in FIG. 17 includes control pattern memory address generator 654 and control pattern memory 656. Control pattern memory is coupled to the DSP and analog systems 658 (for example, SMS 610) via action bus 600 (see FIG. 16). DSP and analog systems unit 658 are in turn coupled to the device under test 50. For an alternative embodiment, DSP and analog systems 658 are also coupled to another device under test in second test head 18.

For one embodiment of the invention, control pattern processing unit 652 acts as the digital pattern generators 606 and 608 of FIG. 16.

For one embodiment, digital test subsystem 650 is controlled by the enVision++ executive system 130 of network interface computer 14.

For digital testing of device under test 50, test patterns can be contained in two types of vector memories—namely, control pattern memory 656 or data pattern memory 676. During pattern execution, either one or both of data pattern memory 676 and control pattern memory 656 may be used to generate the data pattern. Dynamic selection of the pattern source, (i.e., either data pattern memory 656 or control pattern memory 656) for each tester channel is performed on a vector by vector basis by pattern select circuitry 666. For one embodiment, pattern select circuitry 666 can also select algorithmic pattern generator 665 dynamically for each tester channel on a vector-by-vector basis.

Data pattern processing unit 674 includes data pattern memory address generator 678 and data pattern memory 676. Pattern select unit 660 is coupled to both data pattern processing unit 674 and control pattern processing unit 652. Pattern select unit 660 is in turn coupled to waveform, timing, and formatter unit 668. Waveform, timing and formatter unit 668 is in turn coupled to pin electronics 64, which in turn are coupled to device under test 50.

Pattern select unit 660 includes pattern select circuitry 666, which is coupled to DSP send unit 662, scan PG unit 664, and algorithmic pattern generator ("APG") 665. Pattern select circuitry 666 is also coupled to control pattern memory 656 and data pattern memory 676. Pattern select circuitry 666 sends its output to waveform, timing, and formatter unit 668.

Waveform, timing, and formatter unit 668 includes waveform memory 670 and timing generators and formatters unit 672.

Pattern select circuitry 666 and waveform, timing and formatter unit 668 operate on an independent per pin basis with respect to device under test 50 and provide independent per pin functions.

Pattern select circuitry 666 sends to waveform memory 670 the appropriate pattern to be applied to waveform memory 670. Waveform memory 670 in turn sends the pattern information to the timing generators and formatters unit 672 which generates the proper timing and formatting for sending the signals to the pin electronics unit 64 and in turn to the device under test 50.

One embodiment of electronic tester 10 provides up to a 250 megahertz non-multiplexed input/output data rate on each individual channel and offers a non-multiplexed 500 megahertz input/output data rate capability with constrained formatting options. An alternative embodiment of electronics tester 10 provides up to 125 megahertz input/output data rates. All data rates are doubled in the multiplexed mode.

Figure 18:
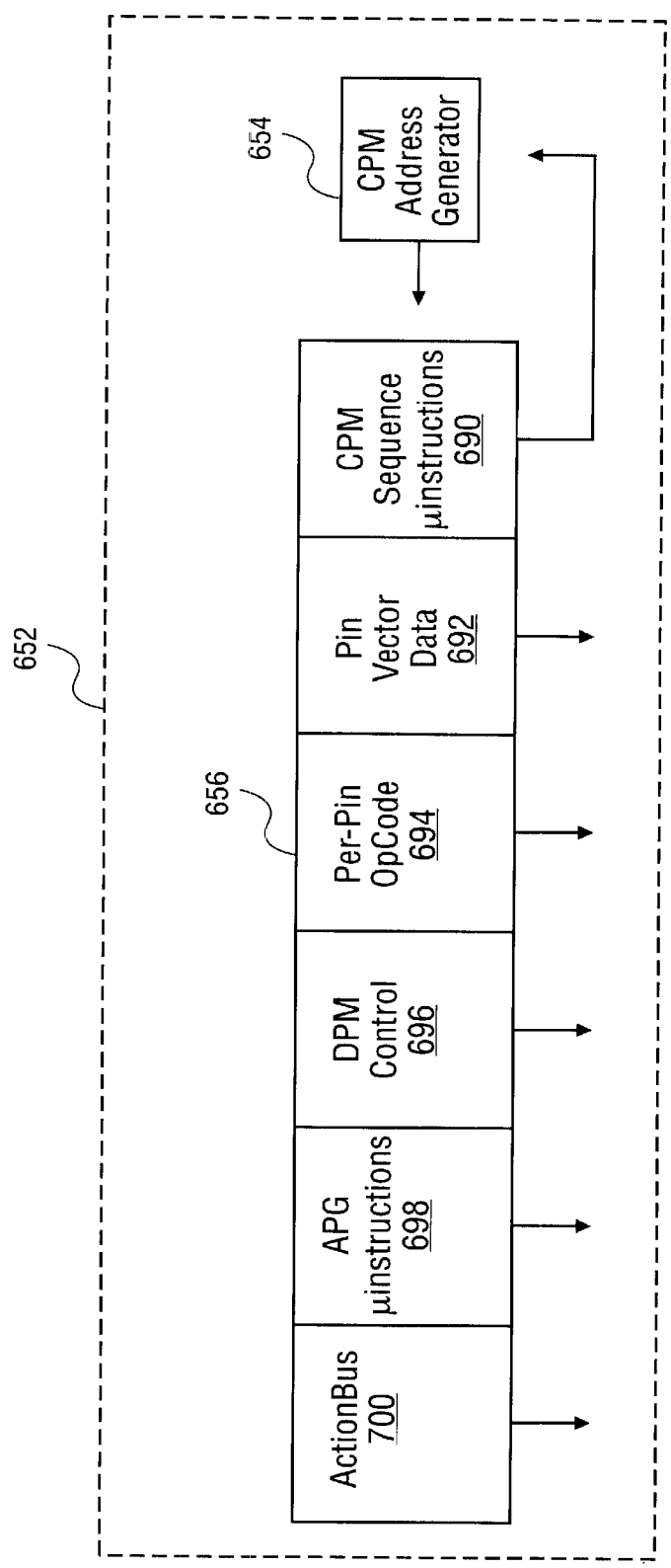
FIG. 18 is a block diagram of the control pattern memory processing unit of the electronic tester.

FIG. 18 illustrates control pattern processing unit 652, which includes control pattern memory address generator 654 and control pattern memory 656. Control pattern memory 656 includes control pattern memory sequence microinstructions 690, pin vector data 692, per-pin opcode 694, data pattern memory control information 696, algorithmic pattern generator microinstructions 698, and action bus marker information 700.

Control pattern processing unit 652 features microinstructions that control the pattern sequence of control pattern memory 656 as well as providing master control of other system resources. The microinstructions 690 and per pin opcode 694 of control pattern memory 656 provide flexible control of over all test pattern execution, including synchronizing vector flow with the data pattern processing unit 674.

The control pattern memory address generator 654 provides addressing to the control pattern memory 656 and steps the control pattern memory 656 through addresses. In particular the control pattern memory address generator 654 steps through the control pattern memory sequence microinstructions 690 and executes them. The control pattern memory sequence microinstructions 690 are used to generate complex pattern sequences that require looping, conditioning, branching, and nested subroutines.

Per pin opcode 694 provides control over per-pin pattern source selection. DPM control information 696 provides control over DPM sequencing. APG microinstructions 698 provide control over algorithmic pattern generator algorithms.

Control pattern memory 656 also includes action bus markers 700. The action bus markers 700 are sent out at various points during the control pattern memory sequence of microinstructions 690. The action bus markers 700 are sent out on action number bus 601 of action bus 600 shown in FIG. 16.

For one embodiment, the control pattern processing unit 652 includes 16 levels of nested subroutines and four 16 bit loop counters. For one embodiment, control pattern processing unit 652 can perform conditional branching and conditional subroutine calls and returns. For one embodiment, control pattern processing unit 652 includes a 16 bit vector repeat counter. For one embodiment, control pattern processing unit 652 can perform sequential match operations. One embodiment, DPM control information 696 includes data pattern memory address, load, and step instructions.

For one embodiment of the invention, control pattern processing unit 652 controls whether or not the vector waveform selection comes from control pattern memory 656 or data pattern memory 676.

The standard control pattern memory 656 vector depth is 32K for one embodiment and 16K for another embodiment. Control pattern memory microinstructions can be executed on every vector when running a test pattern in an extended waveforms mode for one embodiment. In the high frequency format embodiment, control pattern memory microinstructions can be executed on every other vector. For one embodiment, in the extended waveforms mode, pin vector data 692 is 16K by 3 bits per pin. For another embodiment, in the high frequency format, pin vector data 692 is 32K by one bit per pin.

Figure 19:
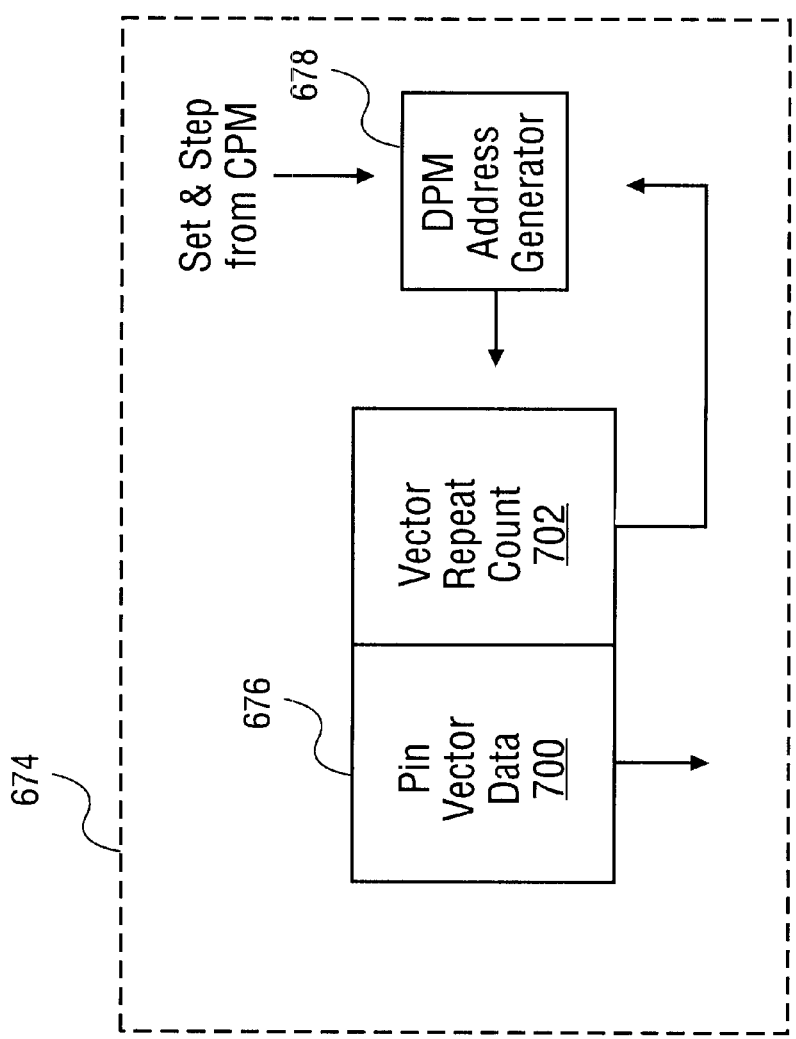
FIG. 19 is a block diagram of the data pattern memory processing unit of the electronic tester.

FIG. 19 illustrates data pattern processing unit 674. Data pattern processing unit 674 includes data pattern memory address generator 678 and data pattern memory 676. Data pattern memory 676 includes vector repeat count information 702 and pin vector data 700.

Data pattern memory address generator 678 receives set and step instructions from the control pattern memory 656. The data pattern memory address generator 678 sends addresses to the vector repeat count portion 702 of data pattern memory 676 in order to step through information in data pattern memory 676. Data pattern memory address generator 678 can receive information from data pattern memory 676.

Data pattern processing unit 674 provides long sequential vector patterns with vector repeat capabilities, which allows test engineers to simulate digitally intensive devices. Each data pattern memory 676 vector location can specify a repeat count of up to 2,047 cycles. Maximum data pattern memory 676 size depends on the configuration and frequency mode of electronic test system 10.

Returning to FIG. 17, during pattern execution, either the data pattern memory 656 or the control pattern memory 676, or both, may be used to generate the data pattern to be applied to device under test 50. For each tester channel, the pattern select unit 660 will perform dynamic selection of the pattern source from either the control pattern memory 656, the data pattern memory 676, or the algorithmic pattern generator 665 on a vector-by-vector basis.

The vectors from the control pattern memory 656 and data pattern memory 676 include a waveform selection address for the waveform select memory 670 for each pin of the DUT 50. For one embodiment, the waveform select memory 670 for each pin is 32k by 8 bits. A control pattern 656 instruction is used to specify whether the data pattern memory 676 or the control pattern memory 656 is to be used for providing this address. The "SWCDPM" control pattern memory 656 instruction selects the data pattern memory 676 as the source for the waveform memory 670 address, effective on the cycle executed. The "SWCCPM" instruction selects the control pattern memory 656 as the source for the waveform memory 670 address effective on the cycle executed.

Figure 20:
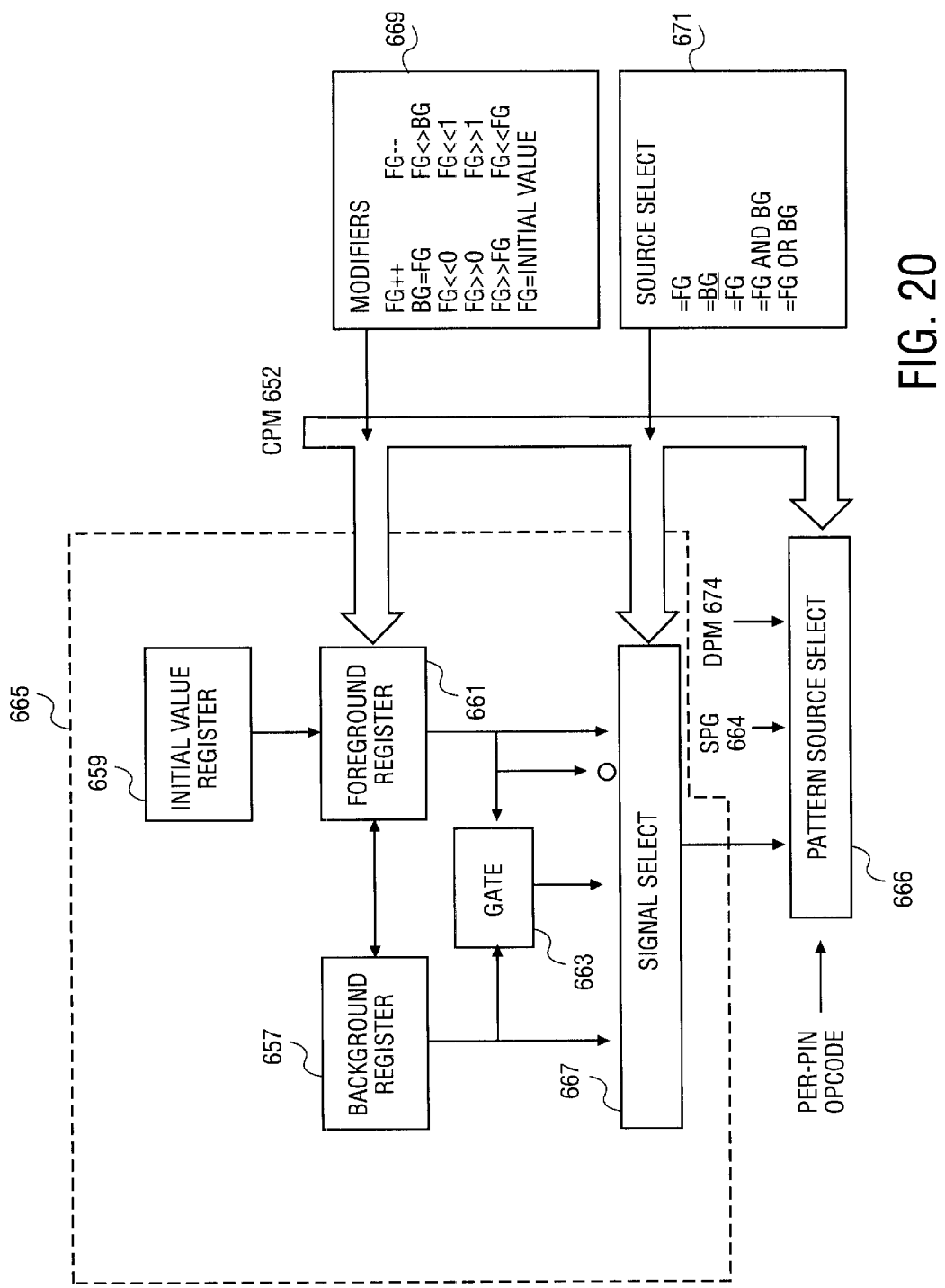
FIG. 20 is a block diagram of the algorithmic pattern generator of the electronic tester.

FIG. 20 shows algorithmic pattern generator ("APG") 665 coupled to CPM unit 652 and pattern source select 666. APG 665 produces digital patterns for testing embedded memory arrays. APG 665 derives its control from CPM unit 652. This allows memory test algorithms to be interspersed with the logic vectors required for accessing embedded memory of DUT 50.

APG can be used for testing embedded memories as well as memory chips.

APG 665 features per pin architecture, which allows a test engineer to configure for "virtual" APG fields. The test engineer can create a relatively wide range of memory test patterns, including march, surround/disturb, and galloping rows/columns. The test engineer can assign any APG 665 signal to any tester channel of electronic tester 10. For one embodiment, APG 665 instructions can be executed up to 250 Megahertz.

APG 665 includes signal select circuitry 667, initial value register 659, foreground register 661, background register 657, and gate 663. The APG instruction codes include modifiers 669 with respect to foreground register 661 and background and register 657. The modifier instructions 669 are sent from CPM unit 652 to APG 665. The modifier instructions 669 include incrementing and decrementing the foreground register 661; loading the contents of the initial value register 659 into foreground register 661; swapping the contents of the foreground and background registers 661 and 657; shifting the contents of foreground register 661 left and right; and shifting the contents of foreground register 661 and adding zeroes and ones. Control logic (not shown) of APG 665 carries out the modifier instructions 669 received from CPM unit 652.

APG 665 includes gate 663 for providing logical operations between foreground register 661 and background register 657. The APG instruction codes include source select instructions 671, which include an "AND" operation with respect to the contents of the foreground and background registers 661 and 657; an "OR" operation with respect to the contents of the foreground and background registers 661 and 657; selection of an inverse of the contents of foreground register 661; and selection of either foreground register 661 or background register 657. Signal select circuitry 667 of APG 665 controls the selection of signals from foreground register 661, background register 657, and gate 663 in response to the source select instructions 671 sent from CPM unit 652.

Figure 21:
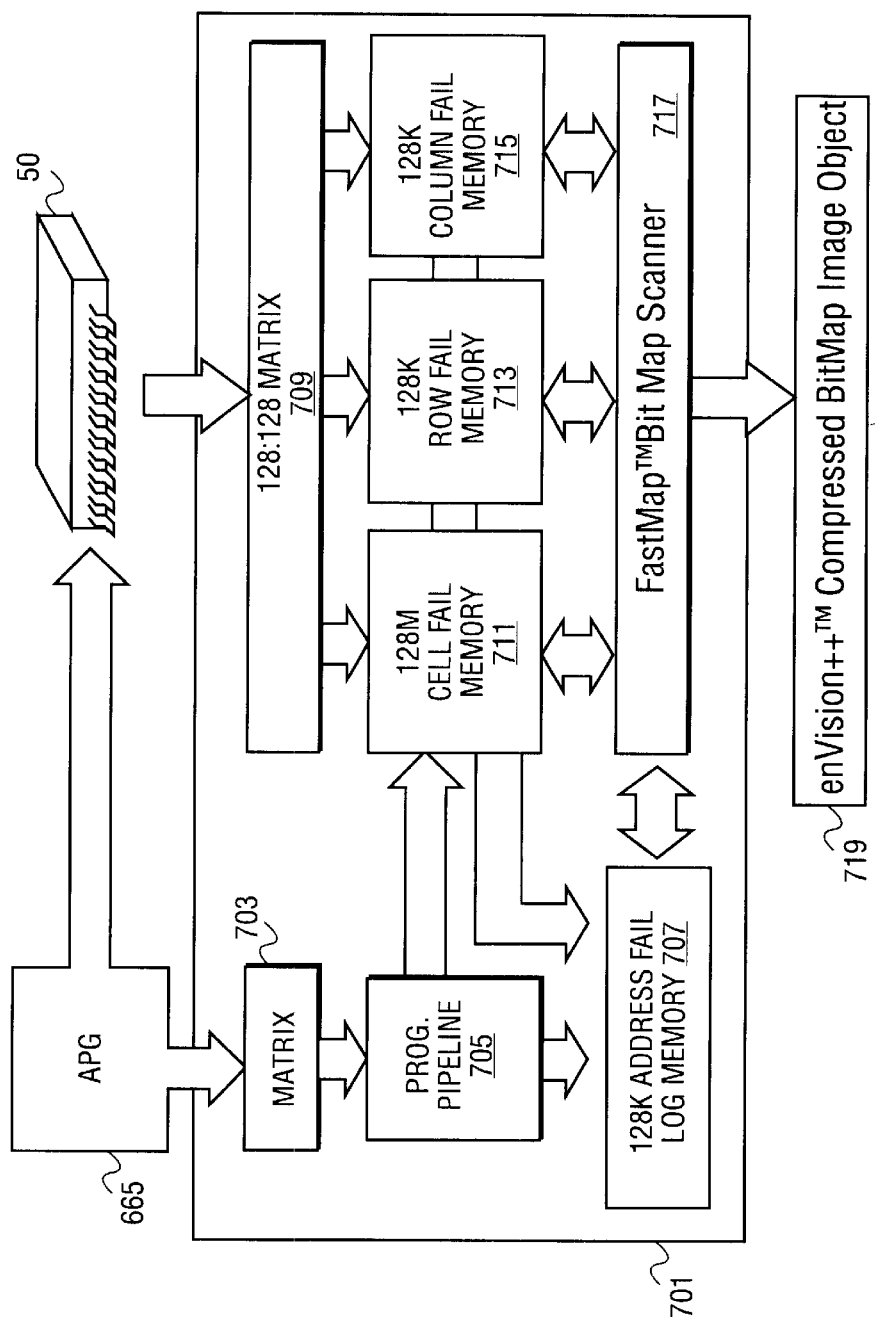
FIG. 21 is a block diagram of the fail log memory of the electronic tester.

FIG. 21 is a block diagram of the fail log memory ("FLM") 701 used in conjunction with the algorithmic pattern generator 665 to test embedded memories in system-on-a-chip ICs, for example. The FLM 701 will record failures that occur during the testing of the embedded memory of DUT 50 and will record the location of failing cells in the memory array of DUT 50. This failure information is then exported for the purposes of repairing the IC in the event that redundant memory cells are available.

FLM 701 can be used to test embedded memories as well as memory chips.

The device under test 50 is connected through the per-pin compare logic to input matrix 709 that establishes a data connection to the cell fail memory 711, the row fail memory 713, and the column fail memory 715. Simultaneously, the APG 665 provides addressing information through programmable pipeline 705 to the fail memories 711, 713, and 715, and to an address fail log memory 707. A local processor acts as a bit map scanner 717 to organize the fail information into a compressed electronic form for export to the memory repair process. For one embodiment, the bit map scanner 717 includes a Power PC 750 CPU sold by Motorola Corporation of Schaumburg, Ill. Bitmap processor 717 allows for bitmaps and redundancy analysis.

For one embodiment, FLM 701 helps to ensure real-time accumulation of memory array bit map information at rates up to 250 megahertz. The FLM 701 supports an accumulate mode and a mask mode.

The accumulate mode stores DUT 50 memory array errors in the FLM 701 at the same locations as the DUT 50 array addressed by APG 665. APG 665 generates an address that is sent to both DUT 50 and FLM 701. This address goes through a programmable pipeline before it reaches FLM 701 to allow for DUT 50 designs with pipelined address/data. If the CPM 652 microcode contains an FLM 701 log instruction and a channel error exists on any FLM 701 channel, the system accesses the FLM 701 cell memory 711 to see if that memory location has had a previously recorded error. If not, the system records the error in cell memory 711 and records the address in the address fail log memory 707.

The mask mode enables the execution of a test pattern using errors previously accumulated or loaded into FLM 701 to mask out any subsequent errors at those locations in the DUT 50 memory array.

Figure 22:
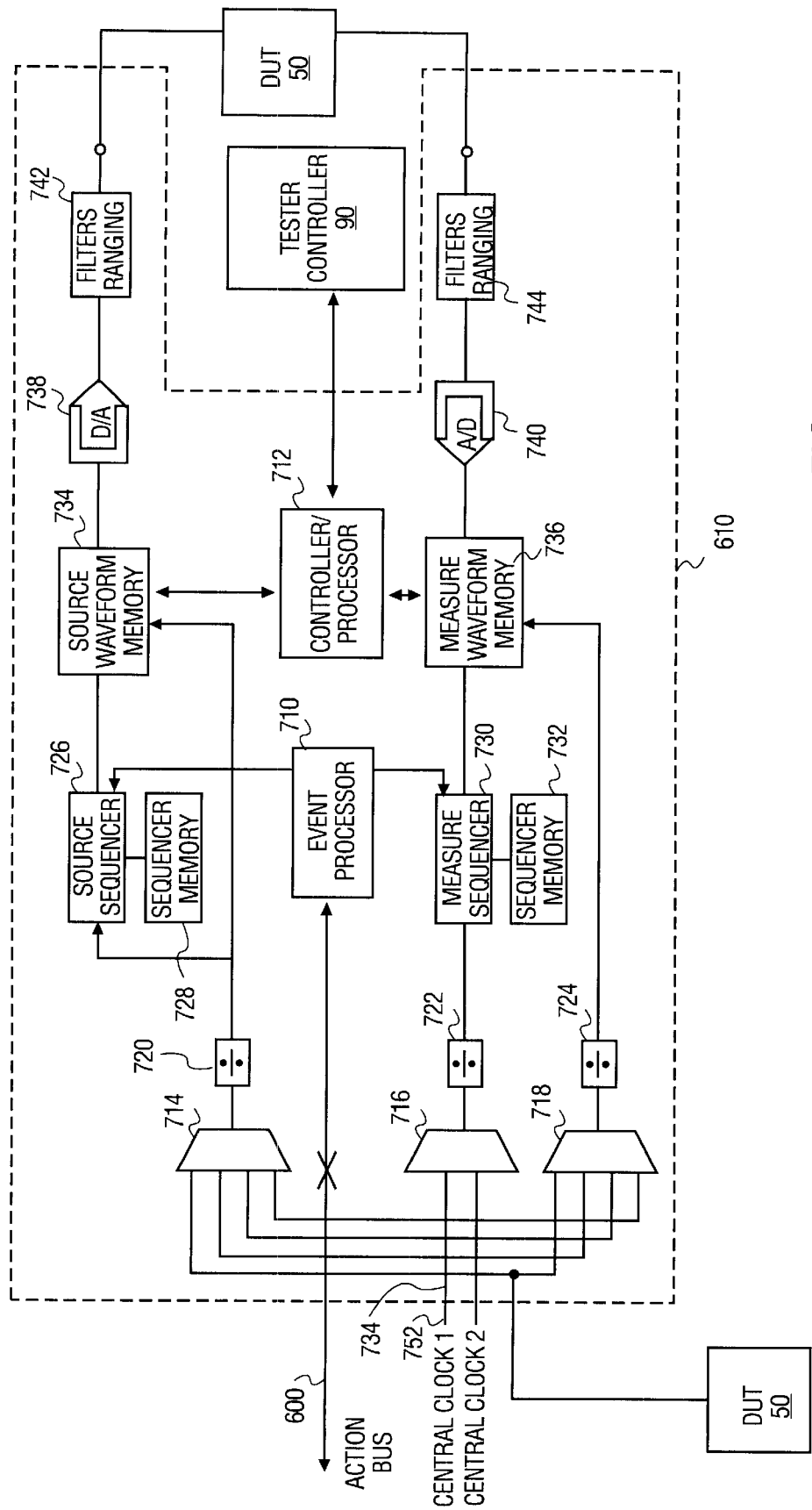
FIG. 22 is a block diagram of the sequenced measure system of the electronic tester.

FIG. 22 is a block diagram of sequenced measure system ("SMS") 610. Sequenced measure system 610 provides the analog source and measure functions with respect to device under test 50. In other words, sequenced measure system 610 is one of the analog testing circuits with respect to device under test 50. SMS 610 sends and receives analog signals with respect to DUT 50. Sequenced measure system 610 is located within analog circuitry 22 of electronic tester 10 (shown in FIG. 1), within analog resources 96 (shown in FIG. 3), and within analog boards 62 (shown in FIG. 4).

Sequence measure system 610 operates cycle by cycle and is controlled by event processor 710, the controller/processor 712, and tester controller 90.

Sequence measure system 610 is coupled to action bus 600, which is in turn coupled to the digital pattern generators 602 and 608 and tester pacemaker 92 of tester controller 90. Sequenced measure system 610 is also coupled to tester controller 90.

Sequenced measure system 610 includes an event processor 710 for initiating analog tests upon receipt of a marker on action number bus 601 of action bus 600. Action number bus 601 and action complete bus 602 of action bus 600 are coupled to event processor 710.

Event processor 710 is in turn coupled to source sequencer 726 and measure sequencer 730. Upon receiving a marker from action number bus 601 of action bus 600, event processor 710 sends signals to either the source sequencer 726 or the measure sequencer 730 to begin a sequence of either source or measure tests with respect to device under test 50. Source sequencer 726, measure sequencer 730, and event processor 710 together comprise the source and measure sequencers 611 shown in FIG. 16.

Source sequencer 726 of FIG. 22 is coupled to sequencer memory 728 which includes microcode for performing source style analog tests with respect to device under test 50. Measure sequencer 730 is coupled to sequencer memory 732. Sequencer memory 732 includes microcode for guiding measure sequencer 730 through analog tests with respect to device under test 50.

Source sequencer 726 is also coupled to source waveform memory 734 containing waveforms with respect to the analog tests with respect to device under test 50. Measure sequencer 730 is coupled to measure waveform memory 736 for performing measure analog tests with respect to device under test 50.

Controller/processor 712 of sequenced measure system 610 oversees and controls the source and measure analog tests performed by the sequence measure system 610 and also performs local analysis of measured data. The controller/processor 712 is in turn coupled to tester controller 90 which controls controller/processor 712.

Controller/processor 712 is coupled to the source waveform memory 734 and the measure waveform memory 736. Controller/processor 712 controls the source waveform memory 734 and the measure waveform 736 with respect to the reading and writing of waveform data with respect to device under test 50. An output of source waveform memory 734 is coupled to an input of digital-to-analog conversion circuitry 738. The output of digital-to-analog conversion circuitry 738 is coupled to filters ranging circuitry 742.

An output of filters ranging circuitry 744 is coupled to an input of analog-to-digital conversion circuitry 740. An output of analog-to-digital conversion circuitry 740 is coupled to an input of measure waveform memory 736.

Multiplexer 714 is coupled to clock divider circuitry 720. Clock divider circuitry 720 is coupled to source waveform memory 734 and source sequencer 726. Multiplexer 714 is coupled to device under test 50 and clock lines 752 and 754. Multiplexer 714 is also coupled to multiplexer 716 and 718.

Multiplexer 718 is coupled to clock divider unit 724, which is in turn coupled to measure waveform memory 736. Multiplexer 716 is coupled to clock divider circuitry 722, which in turn is coupled to measure sequencer 730. Multiplexers 714, 716, and 718 each have inputs coupled to device under test 50.

Figure 23:
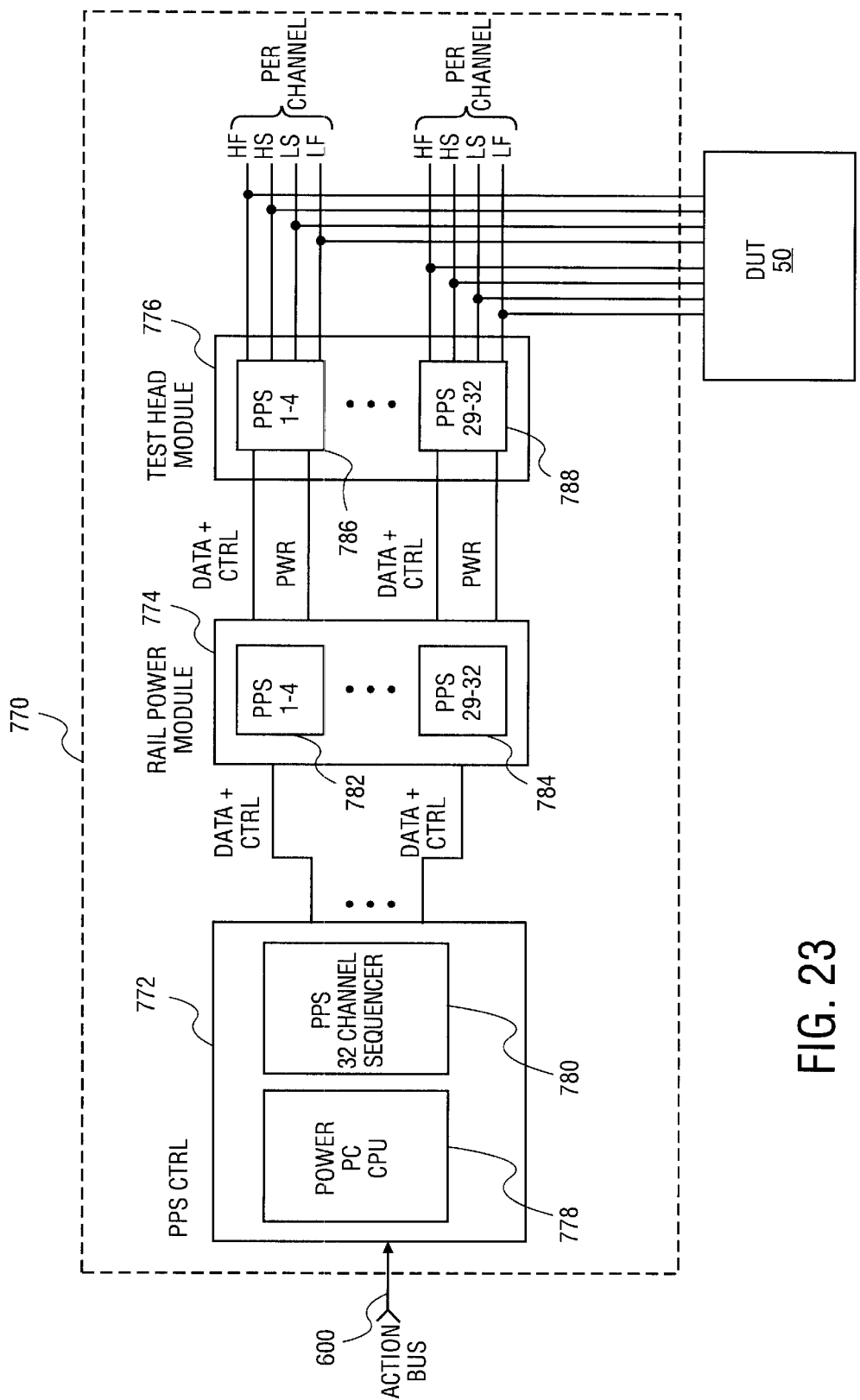
FIG. 23 is a block diagram of the pulsed power source of the electronic tester.

FIG. 23 is a block diagram of pulse power source ("PPS") 770 of electronic tester 10. Pulse power source 770 is coupled to action number bus 601 and action complete bus 602 of action bus 600. PPS is also coupled to DUT 50. Pulse power source 770 is a multichannel high-power voltage/current source designed to test the smart power blocks on a system-on-a-chip IC. Pulse power source circuitry 770 is thus used for analog testing of device under test 50.

Pulse power system 770 resides within analog circuitry 22 and test head 16 (shown in FIG. 1). Pulse power circuitry 770 also resides within analog board 62 and test head 16 shown in FIG. 4. Pulse power circuitry 770 also resides in analog resources 96, test head interface 98, and test head 16 (shown in FIG. 3).

Pulse power source 770 shown in FIG. 23 includes pulse power source controller 772, which is coupled to action bus 600. Power pulse controller 772 includes a Power PC CPU microprocessor 778 sold by Motorola Corporation of Phoenix, Ariz. Power pulse source controller 772 also includes a sequencer 780 with 32 channels.

The pulse power source sequencer 780 is in turn coupled to rail power module 774, which in turn is coupled to test head module 776. Test head module 776 is coupled to the device under test 50.

Pulse power source sequencer 780 sends 32 channels of data and control information to rail power module 774. Rail power module 774 includes pulse power source rail power units covering all 32 channels, including rail power unit 782 covering channels one to four and rail power unit 784 covering channels twenty-nine to thirty-two shown in FIG. 23. Rail power module 774 in turn sends data, control, and power signals to test head module 776. Test head module 776 includes pulse power source test head units for all 32 channels, including test head unit 786 (for channels 1–4) and test head unit 788 (for channels 29–32) shown in FIG. 23. Test head module 776 in turn sends per channel HF, HS, LS, and LF signals to device under test 50.

Under the control of pulse power source sequencer 780, each pulse power source channel can produce voltages up to 100 volts or currents up to 10 amps for one embodiment, providing timing resolution of one microsecond on any event across all channels.

The pulse power source 770 sends signals to test head 16 resident power amplifiers that provide the bandwidth necessary to handle device transients and produce pulsed load waveforms. The pulse power source sequencer 780 is programmable, which enables the test engineer to program the output values of all amplifiers and determine the timing relationship between consecutive values on any number of channels or the relative timing between channels.

Pulse power sequencer 780 also allows the test engineer to place measure strobes relative to any forced value across all channels and make single or multiple measurements on any number of channels. These features enable parallel measurement of multi-output devices and digitizing of any power waveform that can then be analyzed using DSP math functions.

Controller 772 of PPS 770 is coupled to action bus 600. Controller 772 can be triggered to measure the current at a point in the digital pattern when controller 772 receives a marker over action number bus 601 of action bus 600 sent by either digital pattern generator 606 or digital pattern generator 608. This allows full characterization of power usage.

Figure 24:
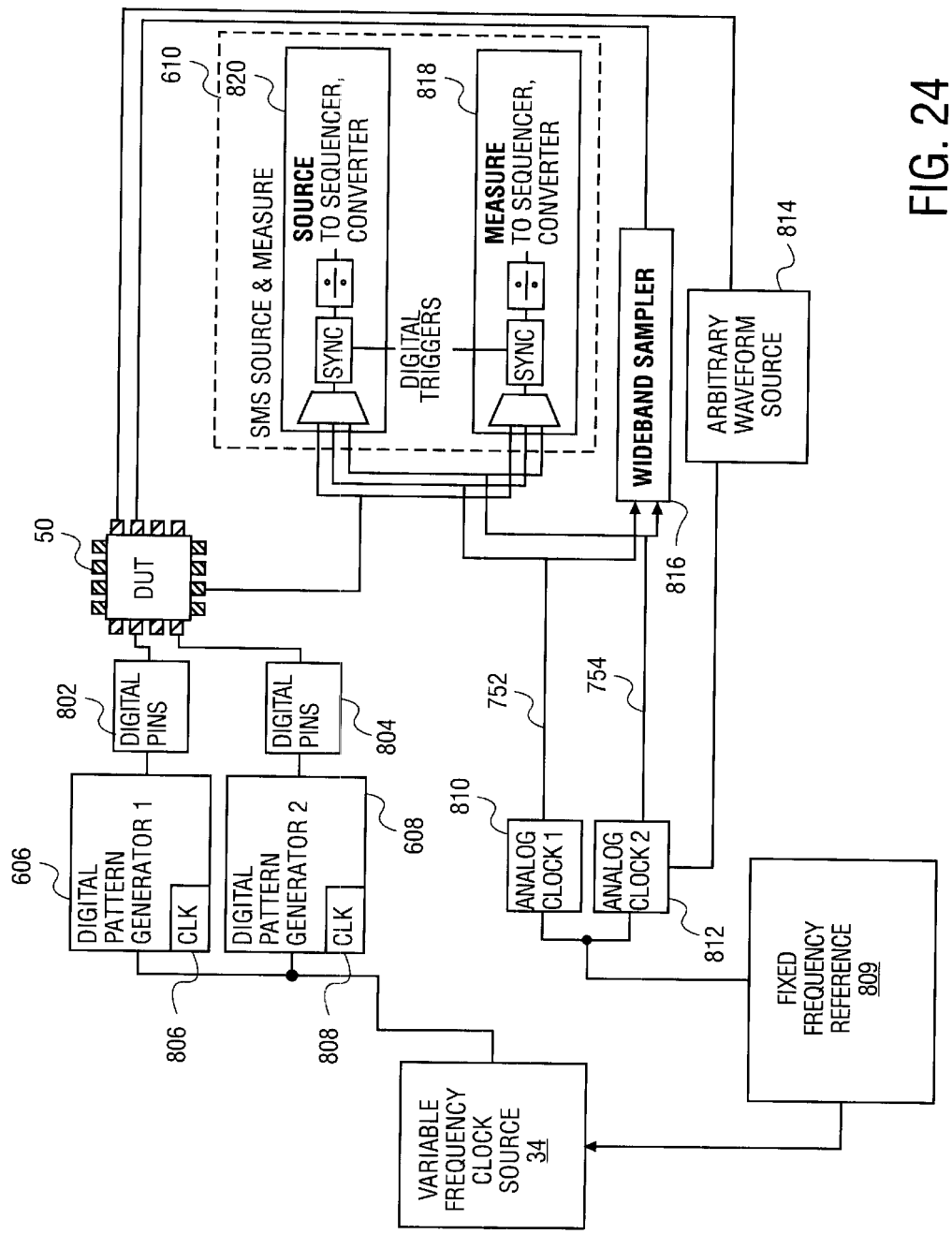
FIG. 24 is a block diagram of the clocking architecture of the electronic tester.

FIG. 24 shows the clocking architecture of electronic test system 10. Digital pattern generator 606 is coupled to digital pins 802 which in turn are coupled to device under test 50. Digital pattern generator 608 is coupled to digital pins 804, which in turn are coupled to device under test 50. Digital pattern generators 606 and 608 generate the digital test patterns for device under test 50. Sequenced measure system 610 performs the sequence source and measure analog tests with respect to device under test 50. Sequenced measure system 610 is coupled to DUT 50. Sequenced measure system 610 includes a source circuitry 820 and measure circuitry 818. Source circuitry 820 includes multiplexer 714, divider 720, source sequencer 726, sequencer memory 728, source waveform memory 734, and event processor 710 (shown in FIG. 22). Measure circuitry 818 includes multiplexers 732, measure waveform 736, and event processor 710 (shown in FIG. 22).

Wideband sampler 816 shown in FIG. 24 is coupled to the SMS 610. Wideband sampler 816, which is coupled to DUT 50, provides a high bandwidth interface to device under test 50 for any of the DSP or time measure instruments in the tester.

Fixed low frequency clock source 809 provides a global clock source for electronic test system 10. Clock source 809 is also referred to as the system-wide frequency reference clock source 809 or the reference clock source 809.

The low frequency clock source 809 has a frequency on the order of approximately 10 megahertz.

Fixed low frequency clock source 809 is in turn coupled to a variable frequency reference clock source 34 that is coupled to digital pattern generators 606 and 608. Each of the digital pattern generators 606 and 608 has its own clock source that is generated in response to the variable clock source 34.

Digital pattern generator 606 has its own local clock source 806 that runs at approximately 100 megahertz. The relatively high speed clock 806 is coupled to variable frequency clock source 34 and is derived from variable low frequency clock source 34 by multiplying the frequency of the variable speed clock source 34. Likewise, digital pattern generator 608 includes a local high-speed clock source 808 that is coupled to variable frequency clock source 34 and is derived from clock source 34 by multiplying the frequency of clock source 34. The local high-speed clock source 808 runs at approximately 100 megahertz.

Even though local clocks 806 and 808 typically can run at up to 100 megahertz, those local high speed clock sources 806 and 808 can be varied by varying the frequency of variable clock source 34.

Thus the fact that variable frequency clock source 34 can be varied means that the local clocks 806 and 808 are likewise varied by varying the frequency of clock source 34. In other words, the fact that the clock source 34 can be varied to different frequencies means that the local clock sources 806 and 808 can likewise be varied. Given that the local clock sources 806 and 808 are derived by multiplying the frequency of low speed clock source 34, that means that a broad range of frequencies can be generated by clock sources 34, 806, and 808.

For one embodiment, the frequencies of high speed clocks 806 and 808 can be derived from the variable speed clock by multiplying the frequency of clock 34 by fractions. Thus, for that embodiment, the frequencies of the high speed clocks 806 and 808 would be greater than the frequency of clock 34. For an alternative embodiment, the frequencies of clocks 806 and 808 are derived from clock 34 by multiplying the frequency of clock 34 by numbers greater than one. For that alternative embodiment, the frequencies of clocks 806 and 808 would be greater than the frequency of clock 34.

The user of electronic tester 10 can use network interface computer 10 to adjust the clock frequency of variable clock generator 34, which in turn adjusts the frequencies of clocks 806 and 808.

Each digital pattern generator 606 and 608 can operate at an independent data rate while using the system-wide frequency reference clock source 809. This allows the test engineer to run two functional patterns in parallel at different speeds. In addition, every digital pin of digital pins 802 and 804 contains a non-harmonically related clock that can change frequency on a vector-by-vector basis and continue running between patterns in order to keep alive circuits on device under test 50, such as on-board phase lock loops or switched capacitor filters that cannot be left idle between tests.

Analog clocks 810 and 812 provide clocking for the sequenced measure system 610, wide band sampler 816, and arbitrary waveform source 814, which are used for analog testing of DUT 50. Analog clock 812 is coupled to arbitrary waveform source 814 and wideband sampler 816. Analog clock 810 is coupled to sequenced measure system 610 and wideband sampler 816.

For one embodiment, analog clocks 810 and 812 are independent analog master clocks that drive all of the DSP instruments in electronic tester 10 with frequencies from 100 megahertz up to 2.4 gigahertz. This clocking flexibility allows the test engineer to create any clocking relationship required to implement techniques such as coherent undersampling of high speed waveforms. In addition, these multiple high-resolution clock sources 810 and 812 allow the test engineer to set up undersampling applications with many effective sampling rates.

Analog clock 810 and 812 are coupled to fixed clock reference 809. Analog clocks 810 and 812 derive their frequencies by multiplying the frequency of global clock 809.

Arbitrary waveform source 814 can sample arbitrary waveforms at speeds up to 2.4 Giga-samples/second with analog bandwidths in excess of one gigahertz. The arbitrary waveform source 814 can provide DSP based waveform generation capability. Arbitrary waveform source 814 is coupled to device under test 50.

For one embodiment of the present invention, variable frequency clock source 34 is a frequency synthesizer model PTS 310D sold by Programmed Test Sources of Littleton, Mass. The design of the internal circuitry of variable frequency clock source 34 itself is not, however, intended to be part of the present invention.

Figure 25:
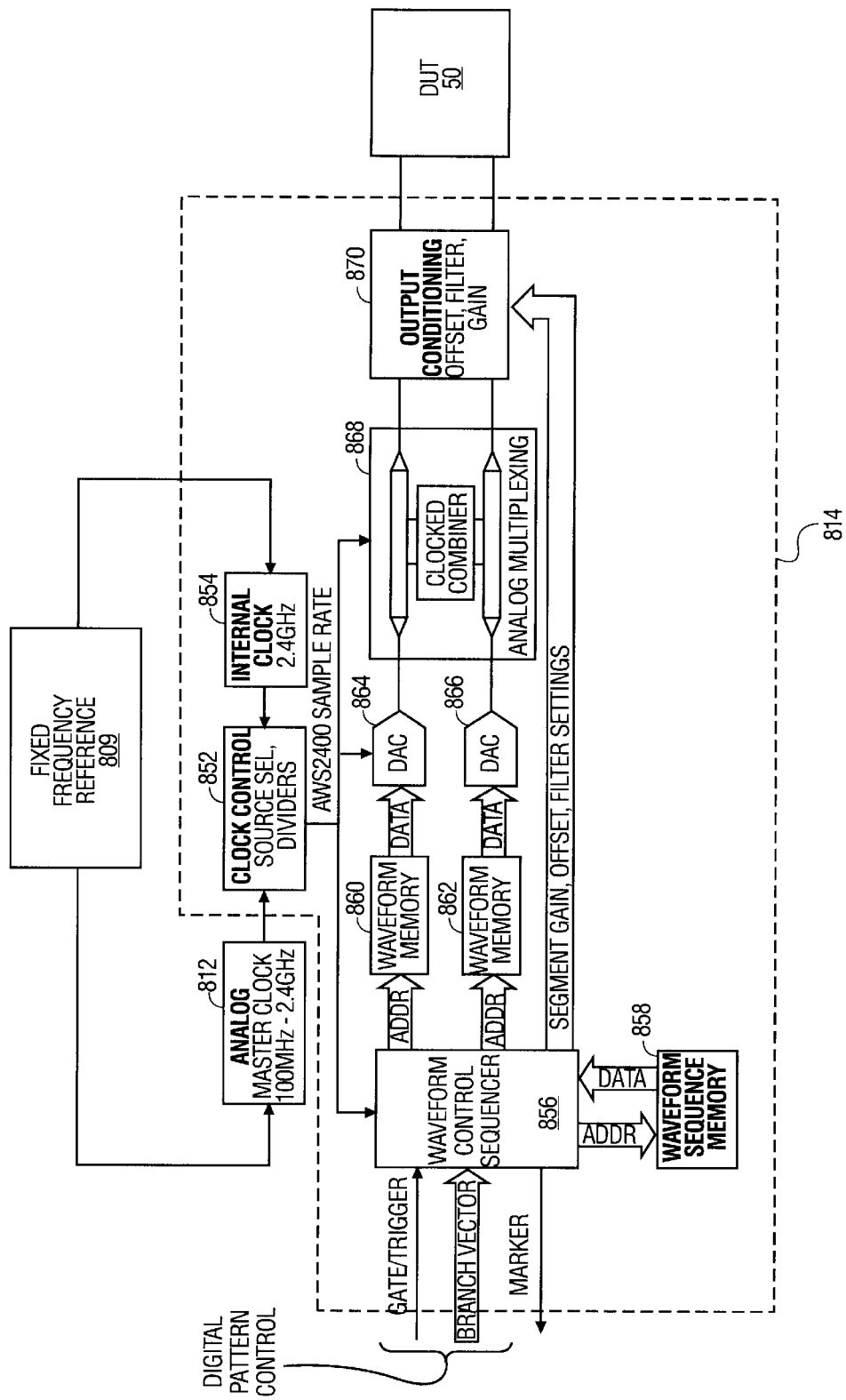
FIG. 25 is a block diagram of the arbitrary waveform source of the electronic tester.

FIG. 25 is a block diagram of arbitrary waveform source 814, which is used to perform analog tests with respect to device under test 50. Arbitrary waveform source 814 is used for applications such as hard disk drive or high-speed datacom applications, which require high-speed arbitrary waveforms. Arbitrary waveform source 814 can also be used to generate sine waves or multitones for general DSP applications, such as analog to digital converters and analog filter testing. Arbitrary waveform source 814 features synchronization to a digital pattern, output ranging, and differential outputs. For one embodiment, arbitrary waveform source 814 resides within (1) analog circuitry 22 and test head 16 shown in FIG. 1; (2) analog resources 96, test head interfaces 98 and 100, and test heads 16 and 18 shown in FIG. 3; and (3) analog boards 62 and test head 16 shown in FIG. 4.

As shown in FIG. 25, the fixed frequency reference 809 provides inputs to analog master clock 812 and internal clock 854 of arbitrary waveform source 814. Internal clock 854 derives a clock of 2.4 gigahertz from the fixed frequency reference 809. Analog master clock 812 derives a clock frequency of 100 megahertz to 2.4 gigahertz from fixed clock source 809. Both clocks 812 and 854 send clock signals to clock control circuitry 852, which includes source select and dividers.

Arbitrary waveform source includes a waveform control sequencer 856, a waveform sequence memory 858, waveform memories 860 and 862, digital to analog converters 864 and 866, clocked combiner 868 for analog multiplexing, and output conditioning circuitry 870 that includes an offset, a filter, and gain circuitry. The output conditioning circuitry 870 is coupled to device under test 50.

Digital pattern control in the form of gate/triggers and branch vectors are sent to waveform sequencer 856. The waveform sequencer 856 sends addresses to waveform memories 860 and 862. Waveform memories 860 and 862 send data to the digital-to-analog converters 864 and 866. The digital analog converters 864 and 866 send analog information to the analog multiplexing clocked combiner 868, which in turn sends signals to output conditioning circuitry 870, which in turn sends signals to the device under test 50.

Waveform control sequencer 856 also sends segment gain, offset, and filter settings to output conditioning circuitry 870. Waveform sequence memory 858 provides data to waveform control sequencer 856 at addresses specified by sequencer 856. Microcode for the waveform control sequencer 856 is stored in waveform sequence memory 858.

Figure 26:
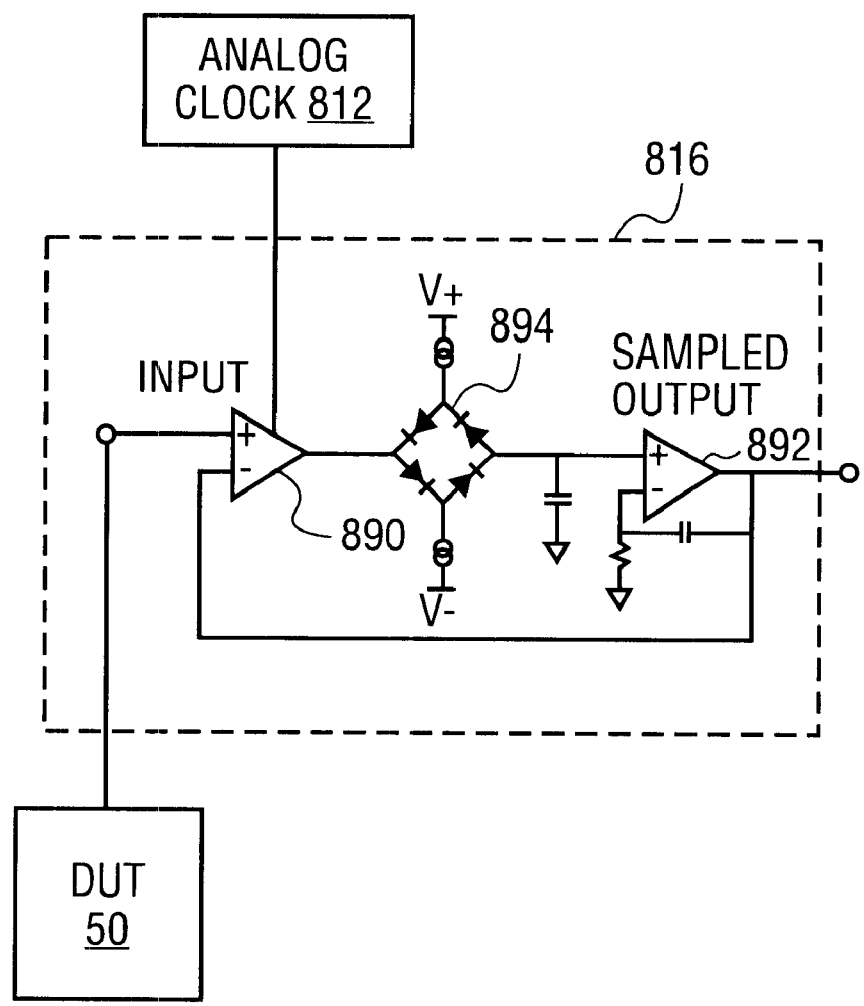
FIG. 26 is a diagram of the wideband sampler of the electronic tester.

FIG. 26 shows wideband sampler 816, which is clocked by analog clock 812. Wideband sampler 816 provides a high bandwidth interface to device under test 50 for any DSP or time measurement instruments in electronic tester 10. The wideband sampler 816 is thus used for analog testing of DUT 50. The wideband sampler 816 is used for applications such as graphics devices or datacom transmitters for wideband time domain measurements of parameters such as rise time and settling time. The wideband sampler 816 can also be used to complement the arbitrary waveform source 814 as a DSP digitizer front end.

For one embodiment, wideband sampler 816 is located in test head 16 of electronic tester 10.

Wideband sampler 816 can capture signals with bandwidths up to one gigahertz and edges with rise times under 100 picoseconds. Wideband sampler 816 includes an operational amplifier 890 with an input coupled device under test 50. The output of operational amplifier 890 is coupled to bridge 894. Bridge 894 is in turn coupled to sampled output operational amplifier 892.

Thus, a single platform electronic tester 10 has been described that can test digital integrated circuits, analog integrated circuits, mixed signal integrated circuits and system-on-a-chip integrated circuits.

In the foregoing specification, the invention has been described with reference to specific exemplary embodiments thereof. It will, however, be evident that various modifications and changes made be made thereto without departing from the broader spirit and scope of the invention as set forth in the appended claims. The specification and drawings are, accordingly, to be regarded in an illustrative rather than a restrictive sense.

What is claimed is:

1. An electronic tester, comprising:

a test head to couple to a device under test, wherein the device under test can be system-on-a-chip integrated circuit, a mixed signal integrated circuit, a digital integrated circuit, or an analog integrated circuit;

digital test circuitry that applies digital test signals to the device under test coupled to the test head and receives digital outputs from the device under test in response to the digital test signals;

analog test circuitry that applies analog test signals to the device under test coupled to the test head and receives analog outputs from the device under test in response to the analog test signals;

memory test circuitry that applies memory test patterns to the device under test coupled to the test head and receives memory outputs from the device under test in response to the memory test patterns;

a tester computer that supervises the application of digital, analog, and memory test signals from the digital test circuitry, analog test circuitry, and memory test circuitry to the device under test such that signals applied to the device under test can be solely digital test signals, solely analog test signals, solely memory test signals, or mixed digital, analog, and memory test signals, wherein the test head, the digital test circuitry, the analog test circuitry, the memory test circuitry, and the tester computer are operable as a single platform, wherein the digital test signals, the analog test signals, and the memory test patterns can be applied serially or concurrently to the device under test.

2. The electronic tester of claim 1, wherein the memory test circuitry comprises an algorithmic pattern generator.

3. The electronic tester of claim 2, wherein the memory test circuitry further comprises a fail log memory.

4. The electronic tester of claim 1, wherein the digital test circuitry comprises a control pattern memory processing unit and a data pattern memory processing unit.

5. The electronic tester of claim 1, wherein the analog test circuitry comprises a sequenced measure system.

6. The electronic tester of claim 5, wherein the analog test circuitry further comprises vector radio frequency circuitry.

7. The electronic tester of claim 1, wherein the analog test circuitry comprises a pulsed power source.

8. The electronic tester of claim 1, wherein the digital test circuitry, the analog test circuitry, and the memory test circuitry are modular and reconfigurable.

9. An electronic tester, comprising:

means for applying digital test signals to a device under test and receiving digital outputs from the device under test in response to the digital test signals;

means for applying analog test signals to the device under test and receiving analog outputs from the device under test in response to the analog test signals;

means for applying memory test patterns to the device under test and receiving memory outputs from the device under test in response to the memory test patterns;

computing means for supervising the application of digital, analog, and memory test signals to the device under test by the means for applying digital test signals, analog test signals, and memory test patterns, wherein the device under test can be a system-on-a-chip integrated circuit, a mixed signal integrated circuit, a digital integrated circuit, an analog integrated circuit, or a memory integrated circuit, wherein the means for applying digital test signals, the means for applying analog test signals, the means for applying memory test patterns, and the computing means are coupled to a single platform, wherein the digital test signals, the analog test signals, and the memory test patterns can be applied serially or concurrently to the device under test.

10. An electronic tester, comprising:

analog test circuitry that applies analog test signals to a device under test coupled to a test head and receives analog outputs from the device under test in response to the analog test signals;

a tester controller that sends action packets to the analog test circuitry to select characteristics of analog tests to be performed by the analog test circuitry;

digital test circuitry that applies digital test signals to the device under test coupled to the test head and receives digital outputs from the device under test in response to the digital test signals;

memory test circuitry that applies memory test patterns to the device under test coupled to the test head and receives memory outputs from the device under test in response to the memory test patterns;

a computer coupled to the tester controller, the digital test circuitry, and the memory test circuitry, wherein the computer causes the tester controller to send action packets to the analog test circuitry to execute analog tests of the device under test, wherein the computer causes the digital test circuitry to execute digital tests of the device under test, and wherein the computer causes the memory test circuitry to execute memory tests with respect to the device under test, wherein the analog tests, the digital tests, and the memory tests can be applied serially or concurrently to the device under test.

11. A method for an electronic tester, comprising:

presenting to a user of the electronic tester a computer-generated graphical user interface for launching an operating system for the electronic tester, wherein the operating system can oversee selectable serial or concurrent execution of digital test programs, analog test programs, and memory test programs for testing a device under test coupled to the electronic tester;

launching the operating system in response to user input via the computer-generated graphical user interface.

* * * * *